US008922790B2

(12) United States Patent
Sai et al.

(10) Patent No.: US 8,922,790 B2
(45) Date of Patent: Dec. 30, 2014

(54) OPTICAL FILM THICKNESS MEASURING DEVICE AND THIN FILM FORMING APPARATUS USING THE OPTICAL FILM THICKNESS MEASURING DEVICE

(75) Inventors: Kyokuyo Sai, Kanagawa (JP); Yousong Jiang, Kanagawa (JP); Kenji Ozawa, Kanagawa (JP)

(73) Assignee: Shincron Co., Ltd., Yokohama-Shi, Kanagawa (JP)

( * ) Notice: Subject to any disclaimer, the term of this patent is extended or adjusted under 35 U.S.C. 154(b) by 0 days.

(21) Appl. No.: 13/823,527

(22) PCT Filed: Feb. 15, 2012

(86) PCT No.: PCT/JP2012/053572
§ 371 (c)(1),
(2), (4) Date: Oct. 1, 2013

(87) PCT Pub. No.: WO2013/121546
PCT Pub. Date: Aug. 22, 2013

(65) Prior Publication Data
US 2014/0016139 A1 Jan. 16, 2014

(51) Int. Cl.
G01B 11/28 (2006.01)
G01B 11/06 (2006.01)
C23C 14/00 (2006.01)
C23C 14/50 (2006.01)
C23C 14/54 (2006.01)

(52) U.S. Cl.
CPC ........ *G01B 11/0691* (2013.01); *G01B 11/0625* (2013.01); *C23C 14/0078* (2013.01); *C23C 14/505* (2013.01); *C23C 14/547* (2013.01)
USPC .......................................... 356/632; 356/630

(58) Field of Classification Search
USPC .................................................. 356/630, 632
See application file for complete search history.

(56) References Cited

U.S. PATENT DOCUMENTS 5,923,429 A * 7/1999 Takeuchi et al. .............. 356/632

FOREIGN PATENT DOCUMENTS

| JP | 06094424 A | 4/1994 |
| JP | 07103724 A | 4/1995 |
| JP | 2000088531 A | 3/2000 |
| JP | 2006265739 A | 10/2006 |
| JP | 2007211311 A | 8/2007 |

OTHER PUBLICATIONS

International Search Report in the corresponding International Patent Application No. PCT/JP2012/053572 issued Apr. 10, 2012.

* cited by examiner

Primary Examiner — Roy M Punnoose
(74) Attorney, Agent, or Firm — Lowe Hauptman & Ham, LLP

(57) ABSTRACT

An optical film thickness measuring device, enabling direct measurement of a film thickness of a product in real time accurately without a monitor substrate, includes: a projector, a light receiver, inner beam splitters disposed in a base substrate holder to reflect a measurement beam to a base substrate, an inner optical reflector that totally reflects a measurement beam from the closest inner beam splitter, external beam splitters the measurement beam from the inner beam splitters toward the light receiver, and an outer optical reflector that reflects the measurement beam from the optical reflector toward the light receiver. The measurement beam reflected by the inner beam splitters and the inner optical reflector is passed through the base substrate and then reflected by the external beam splitters and the outer optical reflector to be guided to the light receiver, so that the measurement beam is received by the light receiver.

9 Claims, 19 Drawing Sheets (1) BASIC CONFIGURATION

<CASE OF ONE BRANCH>

<CASE OF FOUR BRANCHES>

<CASE OF TWO BRANCHES>

<CASE OF THREE BRANCHES>

<CASE OF FIVE BRANCHES>

(1) BASIC CONFIGURATION

<CASE OF ONE BRANCH>

<CASE OF TWO BRANCHES>

<CASE OF THREE BRANCHES>

<CASE OF FOUR BRANCHES>

<CASE OF FIVE BRANCHES>

FIG. 15

(1) CALCULATION METHOD OF OUTPUT LIGHT IN THE SAME DIRECTION

- RELATIVE OPTICAL OUTPUT    $P = (100\%/n)^2$
- ONE BRANCH  ------------  $P = 100\%$
- TWO BRANCHES  ------------  $n = 2$   $P = 25\%$
- THREE BRANCHES  ------------  $n = 3$   $P = 11.1\%$
- ----        ------------

(2) CALCULATION METHOD OF OUTPUT LIGHT IN THE OPPOSITE DIRECTION

- RELATIVE OPTICAL OUTPUT    $P = (50\%)^n$
- ONE BRANCH  ------------  $P = 100\%$
- TWO BRANCHES  ------------  $n = 2$   $P = 25\%$
- THREE BRANCHES  ------------  $n = 3$   $P = 12.5\%$
- ----        ------------

(3) COMPARISON OF RELATIVE OPTICAL OUTPUT FOR RESPECTIVE BRANCHES

| NUMBER OF BRANCHES | SAME DIRECTION | OPPOSITE DIRECTION |
|---|---|---|
| 1 | 100.00% | 100.00% |
| 2 | 25.00% | 25.00% |
| 3 | 11.00% | 12.50% |
| 4 | 6.25% | 6.25% |
| 5 | 4.00% | 3.13% |

FIG. 16

FIRST EMBODIMENT

| BASE SUBSTRATE (SUBSTRATE) OF UPPER-STAGE PRODUCT | RELATIVE LIGHT INTENSITY % |
|---|---|
| FIRST BEAM SPLITTER (BS1) | 18 |
| MEASUREMENT SUBSTRATE (UPPER STAGE) | |
| THIRD BEAM SPLITTER (BS3) | 50 |
| OUTPUT LIGHT 1 | 9 |

| BASE SUBSTRATE (SUBSTRATE) OF MIDDLE-STAGE PRODUCT | RELATIVE LIGHT INTENSITY % |
|---|---|
| FIRST BEAM SPLITTER (BS1) | 82 |
| SECOND BEAM SPLITTER (BS2) | 45 |
| MEASUREMENT SUBSTRATE (MIDDLE STAGE) | |
| FOURTH BEAM SPLITTER (BS4) | 50 |
| THIRD BEAM SPLITTER (BS3) | 50 |
| OUTPUT LIGHT 1 | 9.2 |

| BASE SUBSTRATE (SUBSTRATE) OF LOWER-STAGE PRODUCT | RELATIVE LIGHT INTENSITY % |
|---|---|
| FIRST BEAM SPLITTER (BS1) | 82 |
| SECOND BEAM SPLITTER (BS2) | 55 |
| FIRST TOTAL REFLECTION MIRROR | 90 |
| MEASUREMENT SUBSTRATE (LOWER STAGE) | |
| SECOND TOTAL REFLECTION MIRROR | 90 |
| FOURTH BEAM SPLITTER (BS4) | 50 |
| THIRD BEAM SPLITTER (BS3) | 50 |
| OUTPUT LIGHT 1 | 9.1 |

FIG. 17

SECOND EMBODIMENT

| BASE SUBSTRATE (SUBSTRATE) OF UPPER-STAGE PRODUCT | RELATIVE LIGHT INTENSITY % |
|---|---|
| FIRST BEAM SPLITTER (BS1) | 33.3 |
| MEASUREMENT SUBSTRATE (UPPER STAGE) | |
| THIRD BEAM SPLITTER (BS3) | 33.3 |
| OUTPUT LIGHT 1 | 11 |

| BASE SUBSTRATE (SUBSTRATE) OF MIDDLE-STAGE PRODUCT | RELATIVE LIGHT INTENSITY % |
|---|---|
| FIRST BEAM SPLITTER (BS1) | 66.7 |
| SECOND BEAM SPLITTER (BS2) | 50 |
| MEASUREMENT SUBSTRATE (MIDDLE STAGE) | |
| FOURTH BEAM SPLITTER (BS4) | 50 |
| THIRD BEAM SPLITTER (BS3) | 66.7 |
| OUTPUT LIGHT 1 | 11 |

| BASE SUBSTRATE (SUBSTRATE) OF LOWER-STAGE PRODUCT | RELATIVE LIGHT INTENSITY % |
|---|---|
| FIRST BEAM SPLITTER (BS1) | 66.7 |
| SECOND BEAM SPLITTER (BS2) | 50 |
| FIRST TOTAL REFLECTION MIRROR (DIELECTRIC) | |
| MEASUREMENT SUBSTRATE (LOWER STAGE) | |
| SECOND TOTAL REFLECTION MIRROR (DIELECTRIC) | |
| FOURTH BEAM SPLITTER (BS4) | 50 |
| THIRD BEAM SPLITTER (BS3) | 66.7 |
| OUTPUT LIGHT 1 | 11 |

FIG. 18

THIRD EMBODIMENT (FIVE BRANCHES)

| FIRST STAGE WORK | RELATIVE LIGHT INTENSITY % |
|---|---|
| FIRST BEAM SPLITTER (BS1) | 20 |
| MEASUREMENT SUBSTRATE (FIRST STAGE) | |
| FIFTH BEAM SPLITTER (BS5) | 20 |
| OUTPUT LIGHT 1 | 4 |

| SECOND STAGE WORK | RELATIVE LIGHT INTENSITY % |
|---|---|
| FIRST BEAM SPLITTER (BS1) | 80 |
| SECOND BEAM SPLITTER (BS2) | 25 |
| MEASUREMENT SUBSTRATE (SECOND STAGE) | |
| SIXTH BEAM SPLITTER (BS6) | 25 |
| FIFTH BEAM SPLITTER (BS5) | 80 |
| OUTPUT LIGHT 2 | 4 |

| THIRD STAGE WORK | RELATIVE LIGHT INTENSITY % |
|---|---|
| FIRST BEAM SPLITTER (BS1) | 80 |
| SECOND BEAM SPLITTER (BS2) | 75 |
| THIRD BEAM SPLITTER (BS3) | 33.3 |
| MEASUREMENT SUBSTRATE (THIRD STAGE) | |
| SEVENTH BEAM SPLITTER (BS7) | 33.3 |
| SIXTH BEAM SPLITTER (BS6) | 75 |
| FIFTH BEAM SPLITTER (BS5) | 80 |
| OUTPUT LIGHT 3 | 4 |

| FOURTH STAGE WORK | RELATIVE LIGHT INTENSITY % |
|---|---|
| FIRST BEAM SPLITTER (BS1) | 80 |
| SECOND BEAM SPLITTER (BS2) | 75 |
| THIRD BEAM SPLITTER (BS3) | 66.6 |
| FOURTH BEAM SPLITTER (BS4) | 50 |
| MEASUREMENT SUBSTRATE (FOURTH STAGE) | |
| EIGHTH BEAM SPLITTER (BS8) | 50 |
| SEVENTH BEAM SPLITTER (BS7) | 66.6 |
| SIXTH BEAM SPLITTER (BS6) | 75 |
| FIFTH BEAM SPLITTER (BS5) | 80 |
| OUTPUT LIGHT 4 | 4 |

| FIFTH STAGE WORK | RELATIVE LIGHT INTENSITY % |
|---|---|
| FIRST BEAM SPLITTER (BS1) | 80 |
| SECOND BEAM SPLITTER (BS2) | 75 |
| THIRD BEAM SPLITTER (BS3) | 66.6 |
| FOURTH BEAM SPLITTER (BS4) | 50 |
| FIRST TOTAL REFLECTION MIRROR (DIELECTRIC) | 100 |
| MEASUREMENT SUBSTRATE (FIFTH STAGE) | |
| SECOND TOTAL REFLECTION MIRROR (DIELECTRIC) | 100 |
| EIGHTH BEAM SPLITTER (BS8) | 50 |
| SEVENTH BEAM SPLITTER (BS7) | 66.6 |
| SIXTH BEAM SPLITTER (BS6) | 75 |
| FIFTH BEAM SPLITTER (BS5) | 80 |
| OUTPUT LIGHT 5 | 4 |

FIG. 19

FOURTH EMBODIMENT (FOUR BRANCHES)

| FIRST STAGE WORK | RELATIVE LIGHT INTENSITY % |
|---|---|
| FIRST BEAM SPLITTER (BS1) | 25 |
| MEASUREMENT SUBSTRATE (FIRST STAGE) | |
| FOURTH BEAM SPLITTER (BS4) | 25 |
| OUTPUT LIGHT 1 | 6.25 |

| SECOND STAGE WORK | RELATIVE LIGHT INTENSITY % |
|---|---|
| FIRST BEAM SPLITTER (BS1) | 75 |
| SECOND BEAM SPLITTER (BS2) | 33.3 |
| MEASUREMENT SUBSTRATE (SECOND STAGE) | |
| FIFTH BEAM SPLITTER (BS5) | 33.3 |
| FOURTH BEAM SPLITTER (BS4) | 75 |
| OUTPUT LIGHT 2 | 6.25 |

| THIRD STAGE WORK | RELATIVE LIGHT INTENSITY % |
|---|---|
| FIRST BEAM SPLITTER (BS1) | 75 |
| SECOND BEAM SPLITTER (BS2) | 66.6 |
| THIRD BEAM SPLITTER (BS3) | 50 |
| MEASUREMENT SUBSTRATE (THIRD STAGE) | |
| SIXTH BEAM SPLITTER (BS6) | 50 |
| FIFTH BEAM SPLITTER (BS5) | 66.6 |
| FOURTH BEAM SPLITTER (BS4) | 75 |
| OUTPUT LIGHT 3 | 6.25 |

| FOURTH STAGE WORK | RELATIVE LIGHT INTENSITY % |
|---|---|
| FIRST BEAM SPLITTER (BS1) | 75 |
| SECOND BEAM SPLITTER (BS2) | 66.6 |
| THIRD BEAM SPLITTER (BS3) | 50 |
| FIRST TOTAL REFLECTION MIRROR (DIELECTRIC) | 100 |
| MEASUREMENT SUBSTRATE (FOURTH STAGE) | |
| SECOND TOTAL REFLECTION MIRROR (DIELECTRIC) | 100 |
| SIXTH BEAM SPLITTER (BS6) | 50 |
| FIFTH BEAM SPLITTER (BS5) | 66.7 |
| FOURTH BEAM SPLITTER (BS4) | 75 |
| OUTPUT LIGHT 4 | 6.25 |

OPTICAL FILM THICKNESS MEASURING DEVICE AND THIN FILM FORMING APPARATUS USING THE OPTICAL FILM THICKNESS MEASURING DEVICE

TECHNICAL FIELD

The present invention relates to an optical film thickness measuring device and a thin film forming apparatus using the optical film thickness measuring device. More specifically, the present invention relates to an optical film thickness measuring device capable of directly measuring a film thickness of a product and measuring a film distribution, and a thin film forming apparatus using the optical film thickness measuring device.

DESCRIPTION OF THE RELATED ART

In the related art, precision optical filters have been generally used in digital cameras, projectors, DVDs, and the like, and a physical vapor deposition (PVD) method such as sputtering or vacuum evaporation has been used in film-formation of these precision optical filters. Moreover, chemical deposition such as CVD has been known as a technique of forming an optical thin film on a surface of a substrate.

In the field of such a thin film forming technique, a carousel-type rotating mechanism is known as an example of a rotating mechanism of a base substrate holding means that holds a substrate (base substrate). In the carousel-type rotating mechanism, a plurality of substrates (base substrates) is held on a peripheral surface of a rotating drum (that is, a base substrate holding means) of which the cross-sectional shape is circular or polygonal, and the rotating drum rotates about a rotating shaft in this state. In this way, in a carousel-type thin film forming apparatus, since the substrates (base substrates) are held on the peripheral surface of the rotating drum, the substrate (base substrate) may not remain at one position during the rotation of the rotating drum, but all substrates (base substrates) rotate about a rotating shaft.

Therefore, in order to measure optical properties of thin films such as a film thickness according to an optical method, it is necessary to perform optical measurement on a substrate (base substrate) after temporarily stopping the rotation of the rotating drum. In such a measurement method, there is a problem in that the thin film forming step takes a long period of time since the thin film forming step needs to be stopped whenever the film thickness is measured.

In order to solve the above-described problem, a method of optically measuring a film thickness in real time in a state where the rotating drum rotates may be considered. For example, a method of projecting a measurement beam onto a substrate (base substrate) from the outside of the rotating drum and receiving a reflection beam reflected from the substrate (base substrate) can be considered. However, in this method, since the rotating drum is rotating as described above, there is another problem in that it is difficult to measure the film thickness accurately since the angle of light incident on the substrate (base substrate) changes frequently.

In order to solve the respective problems described above, a film thickness measuring device that projects and receives light through a rotating shaft of a rotating drum which is a hollow shaft and a thin film forming apparatus including the film thickness measuring device have been developed. The film thickness measuring device includes a rotating drum having a rotating shaft which is a hollow shaft, a total reflection mirror disposed within the rotating shaft, a total reflection mirror disposed on an extension line of the rotating shaft, a light source that emits a measurement beam to the total reflection mirror disposed on the extension line of the rotating shaft via a semi-transparent mirror, and an optical receiver that receives a reflection beam from the total reflection mirror disposed on the extension line of the rotating shaft via the semi-transparent mirror (see, for example, Patent Document 1).

According to the film thickness measuring device, the measurement beam from the light source is emitted to the total reflection mirror disposed on the extension line of the rotating shaft via the semi-transparent mirror. The measurement beam emitted to the total reflection mirror within the rotating shaft is reflected to a measurement glass (monitor substrate) held on the rotating drum. On the other hand, the measurement beam emitted to the measurement glass (monitor substrate) is similarly reflected to the total reflection mirror. The reflection beam is emitted to the optical receiver via the semi-transparent mirror.

In this way, according to the thin film forming apparatus of the related art, since the measurement beam and the reflection beam are guided through the rotating shaft of the rotating drum which is a hollow shaft, it is possible to measure the film thickness of the measurement glass in real time regardless of the fact that the rotating drum is rotating.

However, in the film thickness measuring device, since the emission of the measurement beam to the measurement glass and the reflection of the reflection beam from the measurement glass (monitor substrate) are realized by the single total reflection mirror provided within the rotating shaft, the measurement beam and the reflection beam are introduced from the same end portion of the rotating shaft. Thus, the intensities of the measurement beam and the reflection beam may change due to wobbling, vibration, or the like of the rotating shaft, and an error may occur in the obtained film thickness value.

Therefore, the present applicant has already proposed a film thickness measurement technique so that the above problem can be solved. According to the proposed technique, a film thickness measuring device includes a projecting unit that projects a measurement beam toward an inner portion of a base substrate holding means from one side of an axial line of a rotating shaft, a first optical reflection member that is provided inside the base substrate holding means so as to reflect the measurement beam projected from the projecting unit to a base substrate, a second optical reflection member that is provided inside the base substrate holding means so as to reflect a reflection beam reflected from the base substrate to the other side of the axial line of the rotating shaft, a light receiving unit that receives a reflection beam reflected by the second optical reflection member, and a film thickness computing unit that computes a film thickness of a thin film formed on the base substrate based on the reflection beam received by the light receiving unit (Patent Document 2).

PRIOR ART DOCUMENTS

Patent Documents

Patent Document 1: JP 2000-088531 A (Pages 1 to 5, FIGS. 1 and 2)

Patent Document 2: JP 2007-211311 A

In the technique proposed in Patent Document 2, since the measurement beam and the reflection beam are incident and output from different directions of the axial line of the rotating shaft, it is possible to obtain a high-accuracy film thickness value with small errors. The technique proposed in Patent Document 2 is excellent in that it is possible to obtain a high-accuracy film thickness value with high sensitivity even when measuring the film thickness of a thin film made from a material particularly having low reflectance.

DISCLOSURE OF THE INVENTION

Problems to be Solved by the Invention

However, in the proposed technique, when a plurality of substrates is measured, since a monitor substrate is used, a different substrate (at a phase angle of 120°) disposed at a different position is measured. That is, since the position or space where the monitor substrate (monitor glass) is located is different from that of a product substrate (work substrate) that is subjected to film-formation, the measurement is indirect measurement. Thus, since there is a difference between the monitor substrate (monitor glass) and the product substrate (work substrate) that is subjected to film-formation, the thin film is measured by performing correction using predetermined parameters.

In contrast to the indirect measurement, an optical film thickness meter using a direct-view optical monitor is known. However, the optical film thickness meter using a direct-view optical monitor is generally designed for a single product substrate (work substrate), and those designed for various product substrates are not known.

As described above, when a large number of optical filters are produced and manufactured according to PVD or the like, in the case of sputtering and evaporation, for example, a product substrate (work substrate) is disposed on a drum or a dome and a film is formed on the product substrate (work substrate). In this case, optical filters having uniform performances can be obtained by repeatedly performing steps of making the film thickness uniform to create a trial film and correcting a correction plate.

Since a plurality of channels of optical fibers is used to measure a film distribution, an expensive film thickness meter that includes a plurality of spectrometers is required. Thus, there are problems in that an operation of the film thickness meter is complex, and the cost thereof increases.

With the foregoing in view, an object of the present invention is to provide an optical film thickness measuring device capable of directly measuring the film thickness of a product without using a monitor substrate in a thin film forming apparatus that includes a carousel-type rotating mechanism in particular and measuring the film thicknesses of thin films formed on a plurality of substrates disposed in the same line in real time and at a high accuracy.

Another object of the present invention is to provide a thin film forming apparatus that uses an optical film thickness measuring device capable of directly measuring a product and controlling the film thickness of the product rather than using a monitor substrate.

A further object of the present invention is to provide an optical film thickness measuring device capable of measuring the film thicknesses of products disposed in a plurality of upper and lower stages of a rotating drum using a single optical system and controlling the film thickness, and a thin film forming apparatus using the optical film thickness measuring device.

Means for Solving the Problems

According to an optical film thickness measuring device of the present invention, the above objects are solved by an optical film thickness measuring device for an optical thin film forming apparatus including a rotating base substrate holding means, comprising: a projecting unit that projects a measurement beam from one side of an axial line of a rotating shaft of the rotating base substrate holding means toward the inside of the base substrate holding means, a light receiving unit that receives the measurement beam from the projecting unit, a plurality of inner beam splitters that is provided inside the base substrate holding means so as to reflect the measurement beam projected from the projecting unit to a base substrate, an inner optical reflection member that is provided inside the base substrate holding means so as to totally reflect a measurement beam from the closest inner beam splitter among the plurality of inner beam splitters, a plurality of external beam splitters that is provided outside the base substrate holding means so as to reflect the measurement beam from the plurality of inner beam splitters toward the light receiving unit, and an outer optical reflection member that is provided outside the base substrate holding means so as to reflect the measurement beam from inner the optical reflection member toward the light receiving unit; in which the measurement beam reflected by the plurality of inner beam splitters and the inner optical reflection member is passed through the base substrate and then reflected by the plurality of external beam splitters and the outer optical reflection member so as to be guided to the light receiving unit, so that the measurement beam is received by the light receiving unit.

With the configuration, it is possible to directly measure the film thickness of a product without using a monitor substrate and to measure the film thicknesses of thin films formed on a plurality of substrates disposed in the same line in real time and at a high accuracy. Moreover, since a single optical system is used, and a movable optical component is not used, it is possible to have a high reliability and improve maintenance properties.

In this case, it is preferable for the axial line of the rotating shaft of the base substrate holding means to be positioned within a hollow rotating shaft that forms the center of the base substrate holding means, for the inner beam splitter and the inner optical reflection member to be disposed within the rotating shaft, and for the rotating shaft to be configured such that a wall surface of the rotating shaft allows the reflected measurement beam to pass therethrough. In this case, the measurement beams reflected by the inner beam splitter and the inner optical reflection member have substantially the same intensity.

In this way, when measurement beams having the same intensity are emitted to the respective base substrates (substrates) which are products, it is possible to obtain the same measurement sensitivity (accuracy).

Moreover, it is preferable for the optical film thickness measuring device to further include a film thickness computing unit that computes a film thickness of a thin film formed on the base substrate based on the measurement beam received by the light receiving unit.

Further, it is preferable for the plurality of external beam splitters and the outer optical reflection member to be covered with a hollow housing, and for a portion of the housing to which the measurement beam is incident to be configured such that the portion allows the measurement beam to pass therethrough.

With this configuration, it is possible to prevent contamination of the external beam splitter and the outer optical reflection member and to further improve maintenance properties.

Still further, it is preferable for a shutter device to be provided between the plurality of external beam splitters and the outer optical reflection member.

By using the shutter device in this manner, it is possible to block the optical path, and to exclude a base substrate (substrate) from a measurement target when the base substrate (substrate) as a measurement target is not set.

Moreover, it is preferable for the projecting unit and the light receiving unit to be provided in the same direction or at the same planar position of the optical thin film forming apparatus.

As above, when the projecting unit and the light receiving unit are provided in the same direction of the optical thin film forming apparatus or at the same planar position (for example, on the upper surface of the substrate holding means), since the projecting unit and the light receiving unit are in the same direction or at the same planar position, it is easy to provide the projecting unit and the light receiving unit. Thus the attachment properties and the maintenance properties of the optical film thickness measuring device are improved. In particular, since the projecting unit and the light receiving unit are positioned on the upper surface, various operations such as attachment or maintenance are made easier than when the projecting unit and the light receiving unit are disposed on the lower surface.

Moreover, the projecting unit and the light receiving unit may be provided in the opposite directions or at the opposite planar positions of the optical thin film forming apparatus.

By configuring in this way, since the projecting unit and the light receiving unit can be provided on the opposite sides as in the device according to the related art, it is not necessary to change the layout of the device according to the related art.

According to a thin film forming apparatus of the present invention, the above objects are solved by a rotating thin film forming apparatus forming a thin film, using the optical film thickness measuring device according to any one of claims 1 to 8 including: a base substrate holding means capable of rotating about an axial line of a rotating shaft in a state where a base substrate disposed in a vacuum chamber is held, a film raw material supply means that supplies a film raw material for forming the thin film to the vacuum chamber, and a film-formation process area in which the thin film is formed on the base substrate.

According to the thin film forming apparatus of the present invention, it is possible to provide an apparatus that uses the properties of the optical film thickness measuring device.

As described above, according to the optical film thickness measuring device and the thin film forming apparatus of the present invention, since a plurality of beam splitters and total reflection mirrors are arranged along the axial line of the rotating shaft of the base substrate holding means, it is possible to directly measure the film thicknesses of a plurality of base substrates (substrates) to be products which are arranged along the axial line of the rotating shaft of the base substrate holding means. Therefore, by measuring the plurality of base substrates, it is possible to measure the film thicknesses of the base substrates (substrates) which are the actual products and to directly control the film thickness of the product itself rather than a monitor substrate.

Effects of the Invention

According to the present invention, it is possible to directly measure the film thickness of a product without using a monitor substrate and to measure the film thicknesses of thin films formed on a plurality of substrates disposed in the same line in real time and at a high accuracy.

Moreover, fulfilling the performance required for the optical film thickness meter, when a thin film is formed, it is possible to directly measure a base substrate (product substrate) loaded on the rotating base substrate holding means. It is possible to provide an optical film thickness measuring device capable of measuring the film thicknesses of the products located at a plurality of upper and lower stages of the rotating drum with the same sensitivity (accuracy) and controlling a film thickness by using one optical system, and a thin film forming apparatus using the optical film thickness measuring device. In particular, since a movable optical component is not used, it is possible to obtain high reliability, improve maintenance properties, and to reduce a cost associated with maintenance.

BRIEF DESCRIPTION OF DRAWINGS

FIG. 15 is an explanatory view illustrating methods of calculating optical output in FIGS. 13 and 14, and comparison of relative optical output.

FIG. 16 is a view illustrating the output from a base substrate (substrate) in a first embodiment.

FIG. 17 is a view illustrating the output from a base substrate (substrate) in a second embodiment.

FIG. 18 is a view illustrating the output from a base substrate (substrate) in a third embodiment.

FIG. 19 is a view illustrating the output from a base substrate (substrate) in a fourth embodiment.

REFERENCE NUMERALS

Figure 1:
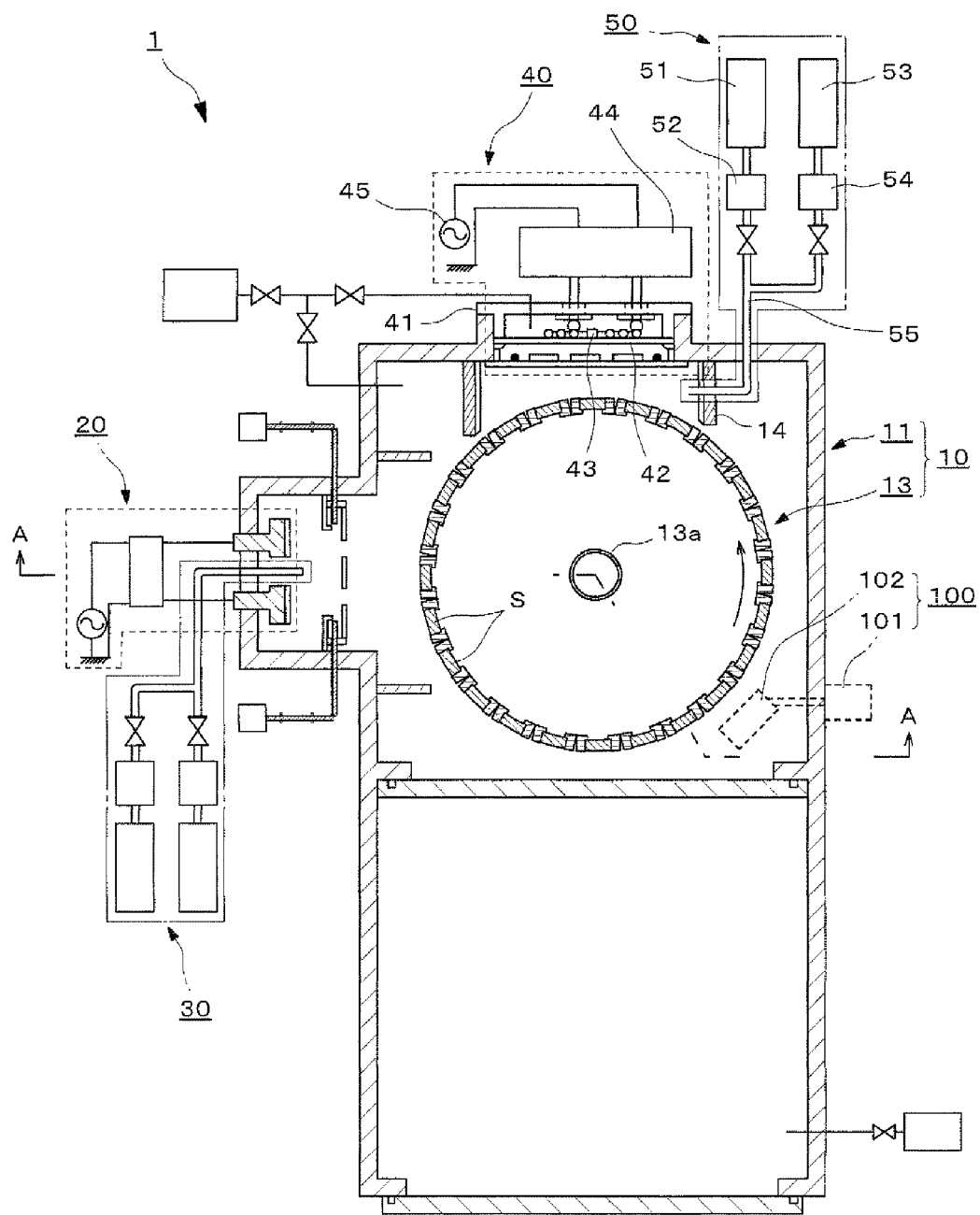
FIG. 1 is a cross-sectional explanatory top view of an optical film thickness measuring device and a thin film forming apparatus according to an embodiment of the present invention.

1: thin film forming apparatus
10: processing chamber
11: vacuum chamber
11*a*: thin film forming chamber
11*b*: load lock chamber 11c, 11d: door
13: rotating drum (base substrate holding means)
13a: rotating shaft
13b, 17a: gear
13c: opening
14: partition wall
15: vacuum pump
16a, 16b: pipe
17: rotating drum driving motor
20: sputtering means
22a, 22b: target
24a: AC power supply
30: sputtering gas supply means
31, 33: mass flow controller
32: sputtering gas cylinder
34: reactive gas cylinder
35: pipe
35a, 35b: correction plate driving motor
36a, 36b, 36c: film thickness correction plate
40: plasma generation means
41: case member
42: dielectric plate
43: antenna
44: matching box
45: high-frequency power supply
50: reactive gas supply means
51: oxygen gas cylinder
52, 54: mass flow controller
53: argon gas cylinder
55: pipe
60: optical film thickness measuring device
61: light source
61a: light-emitting element
61b: filter
62: projection optical fiber
63: projection head
64: projecting-side focusing lens
65a: first beam splitter
65b: second beam splitter
65c: first total reflection mirror
66a: third beam splitter
66b: fourth beam splitter
66c: second total reflection mirror
66k: total reflection mirror
66l, 66m: beam splitter
67: receiving-side optical fiber
68: receiving-side focusing lens
69: reception head
71: spectroscopic measurement device
71a: light-receiving element
71b: light-dispersing element
80: film thickness computing unit
81: CPU
82: memory
83: hard disk
84: I/O port
83a: film thickness correlation data
83b: film thickness computation program
90: film thickness controller
91: film thickness control signal generation unit
100a, 100b, 100c: optical path switching shutter
101: driving unit
102a, 102b, 102c: shielding plate
160: cylindrical member
165a to 165d: beam splitter (BS1 to BS4)
166a to 166d: beam splitter (BS5 to BS8)
165e, 166e: total reflection mirror V: valve
S: base substrate (substrate)

DETAILED DESCRIPTION OF THE INVENTION

Hereinafter, a first embodiment of the present invention will be described with reference to the drawings. Members, arrangements, and the like described below are not limited to the present invention, but may naturally be modified in various manners according to the spirit of the present invention.

Figure 2:
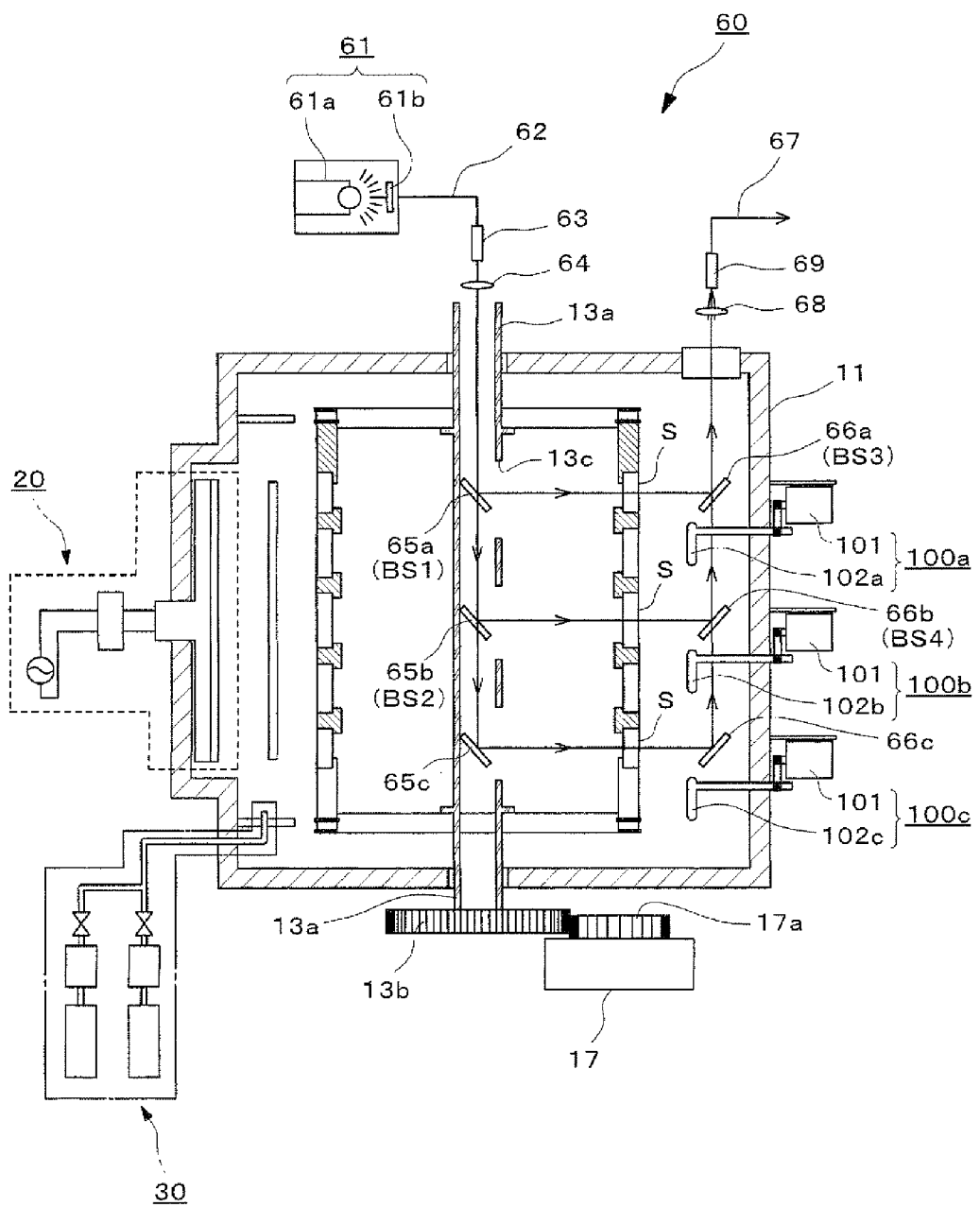
FIG. 2 is a cross-sectional explanatory view of the thin film forming apparatus of FIG. 1 along arrows A-A.
Figure 3:
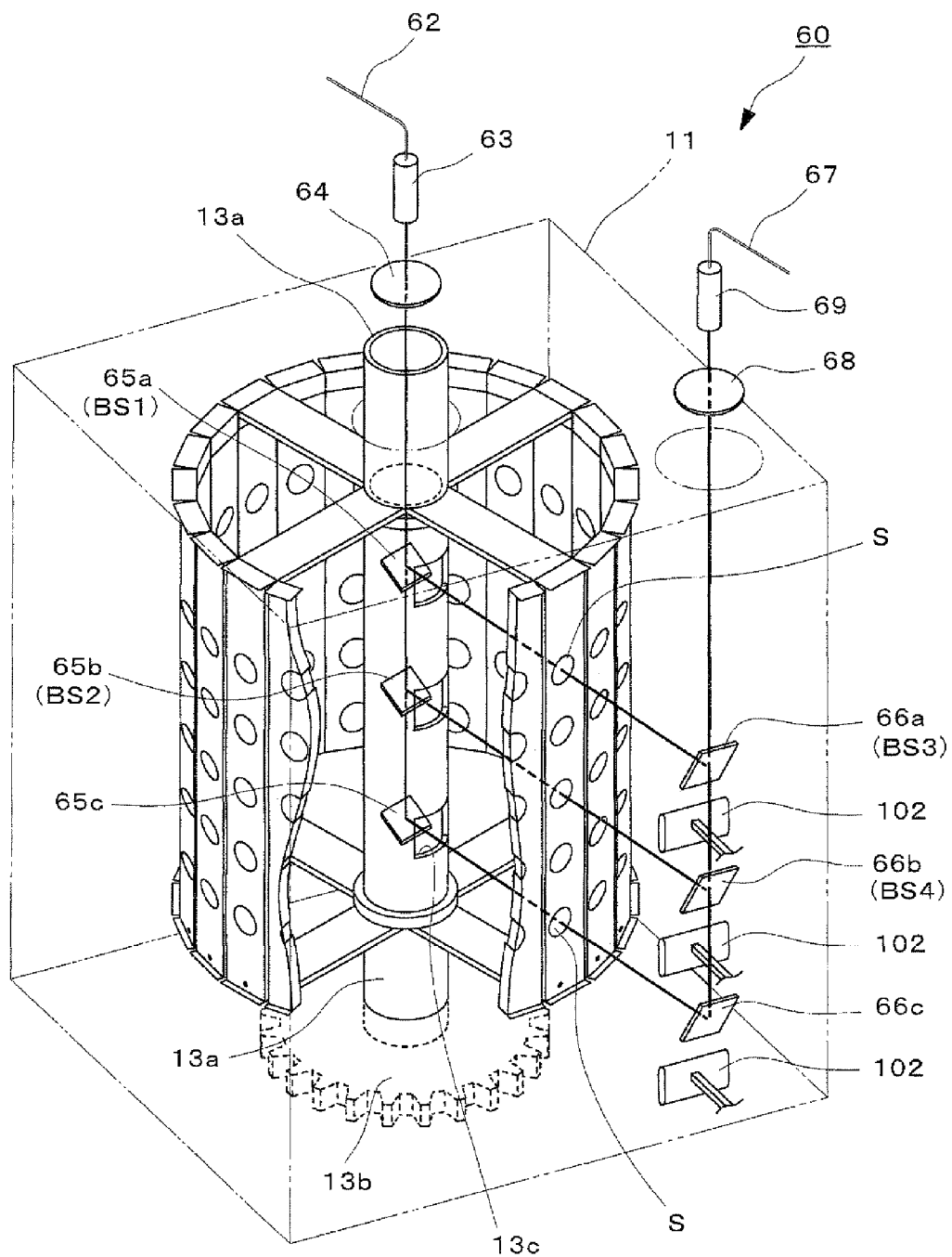
FIG. 3 is a partial cross-sectional perspective top view of a rotating drum of FIG. 2.
Figure 4:
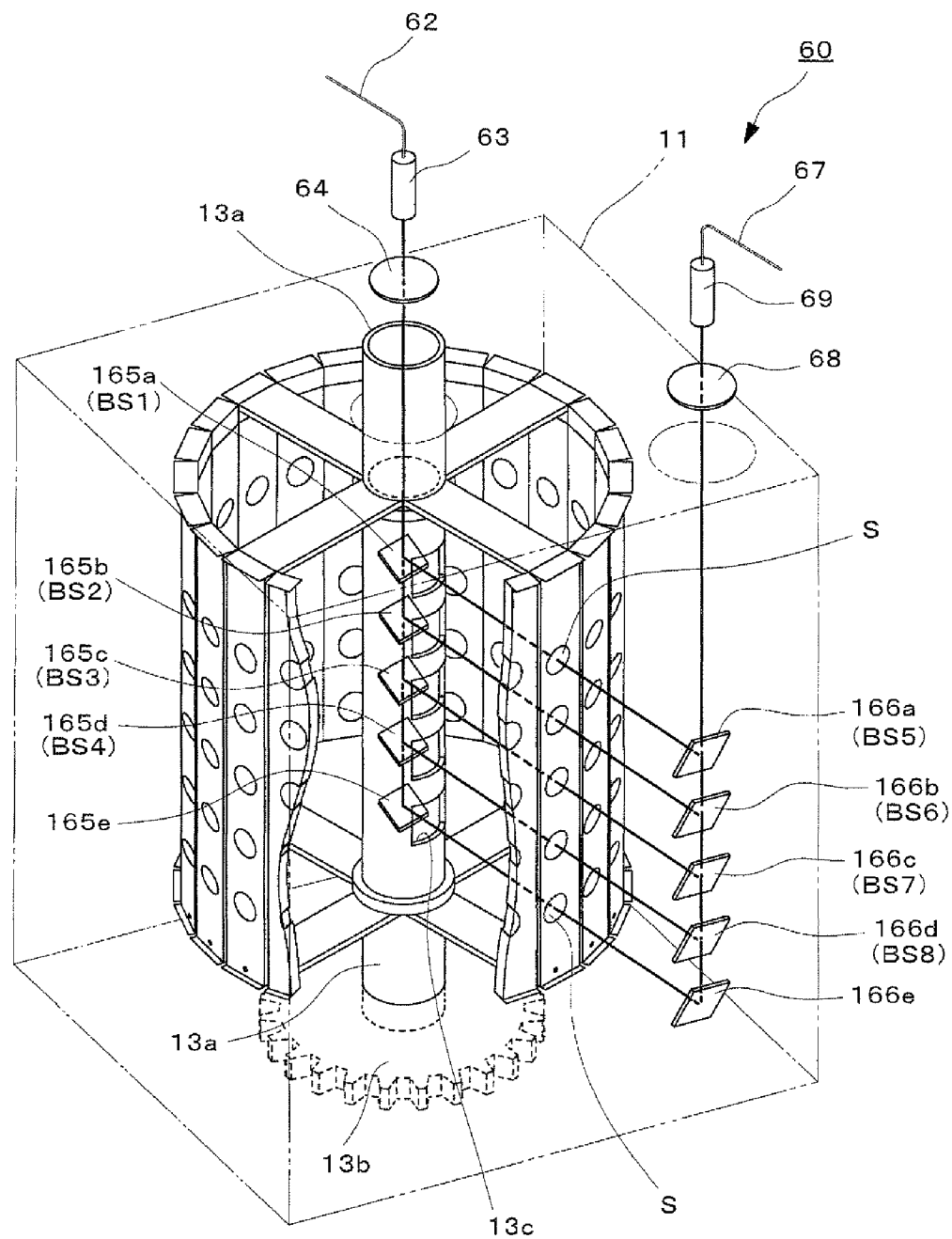
FIG. 4 is a similar partial cross-sectional perspective view to FIG. 3, illustrating a third embodiment.
Figure 5:
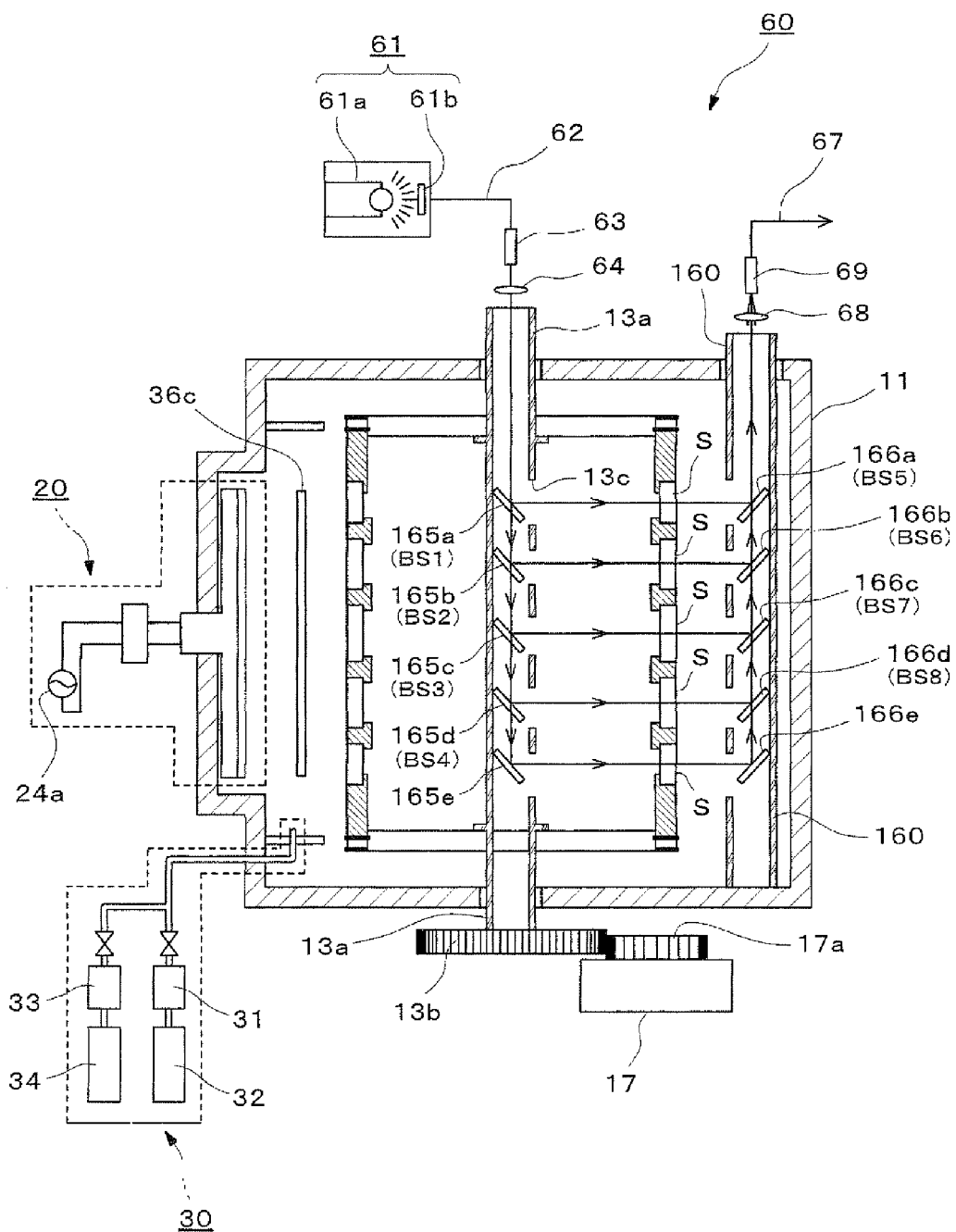
FIG. 5 is a similar cross-sectional explanatory view to FIG. 2, illustrating another example of the third embodiment.
Figure 6:
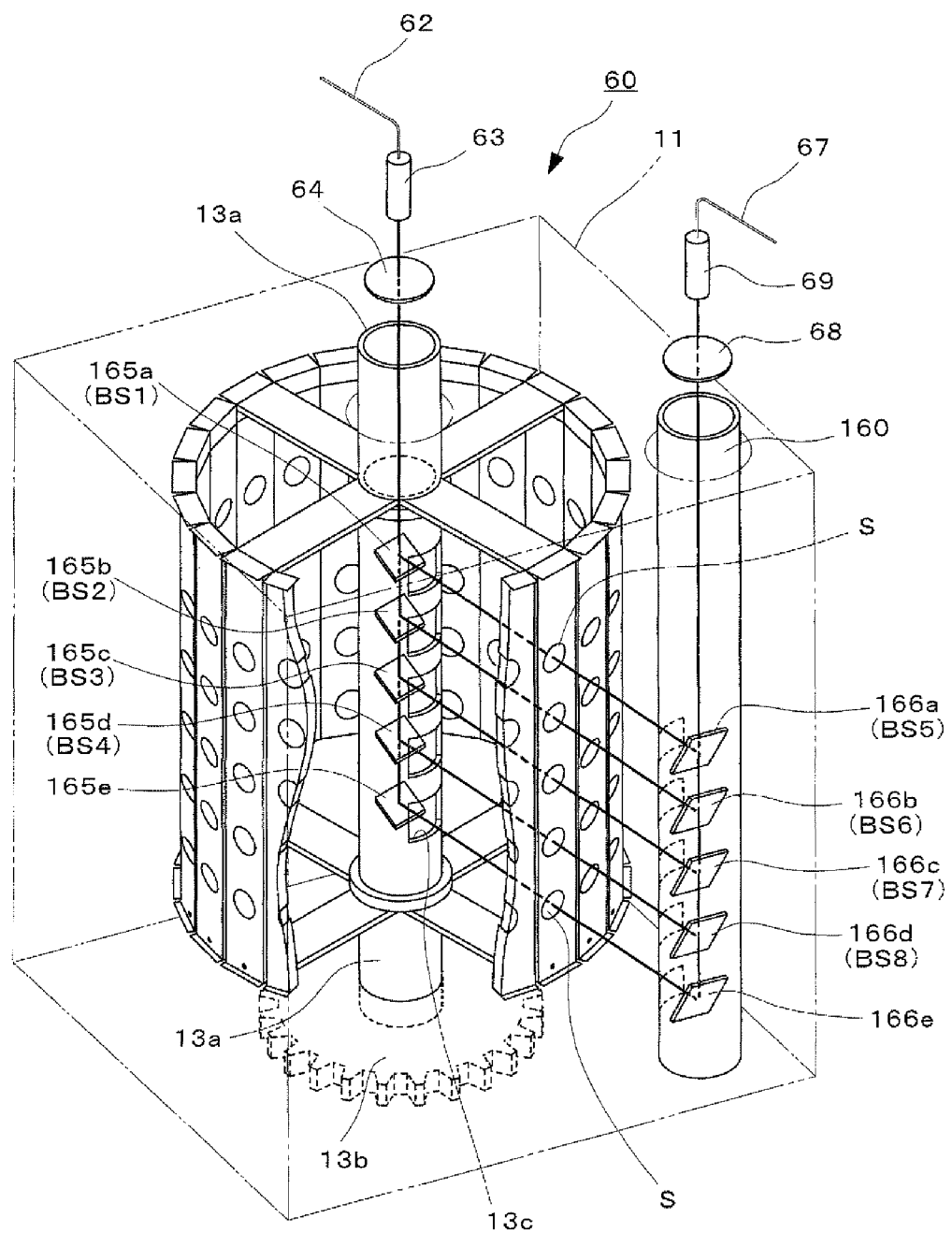
FIG. 6 is a partial cross-sectional perspective top view of a rotating drum of FIG. 5.
Figure 7:
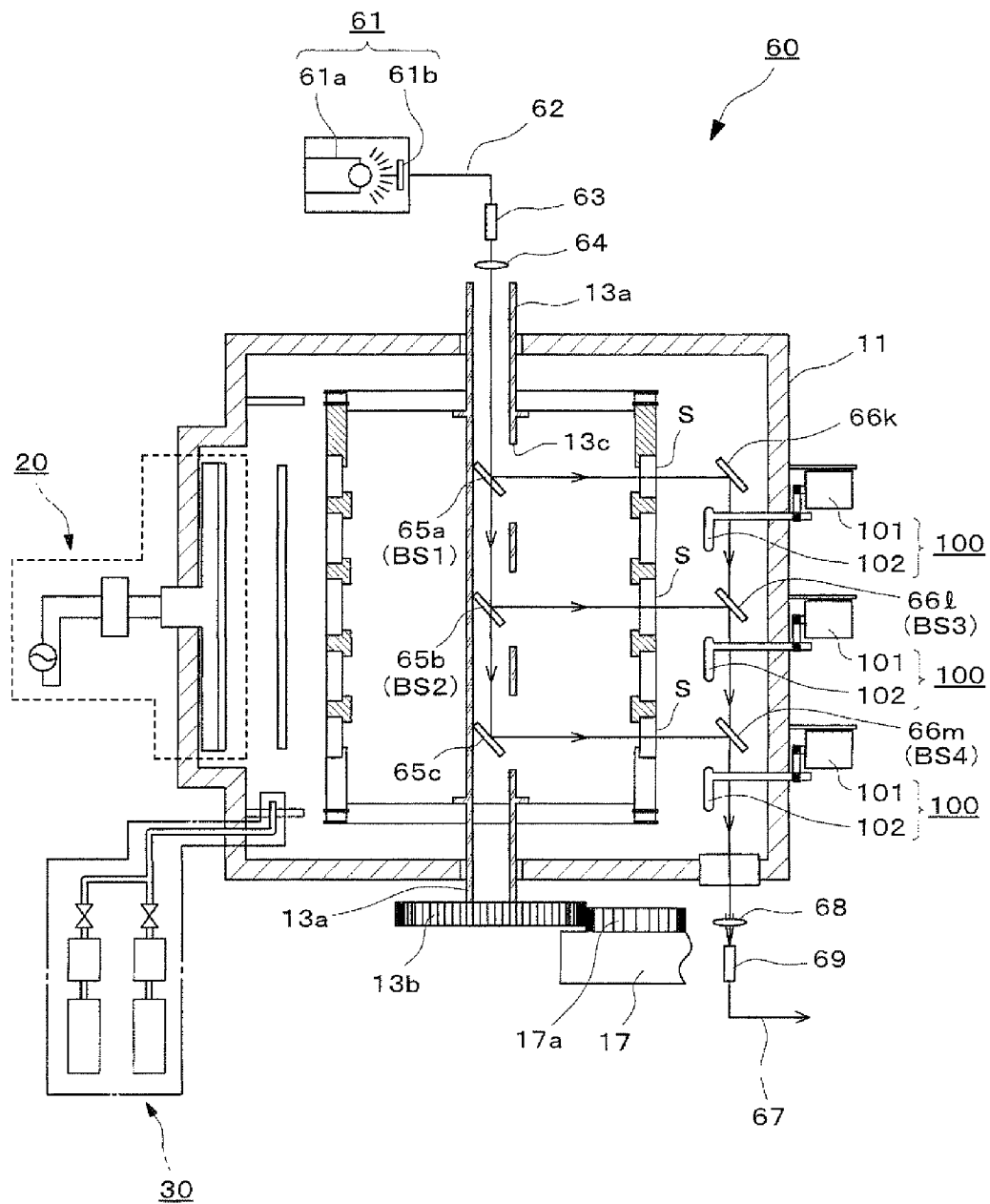
FIG. 7 is a similar cross-sectional explanatory view to FIG. 2, illustrating another example of a fifth embodiment.
Figure 8:
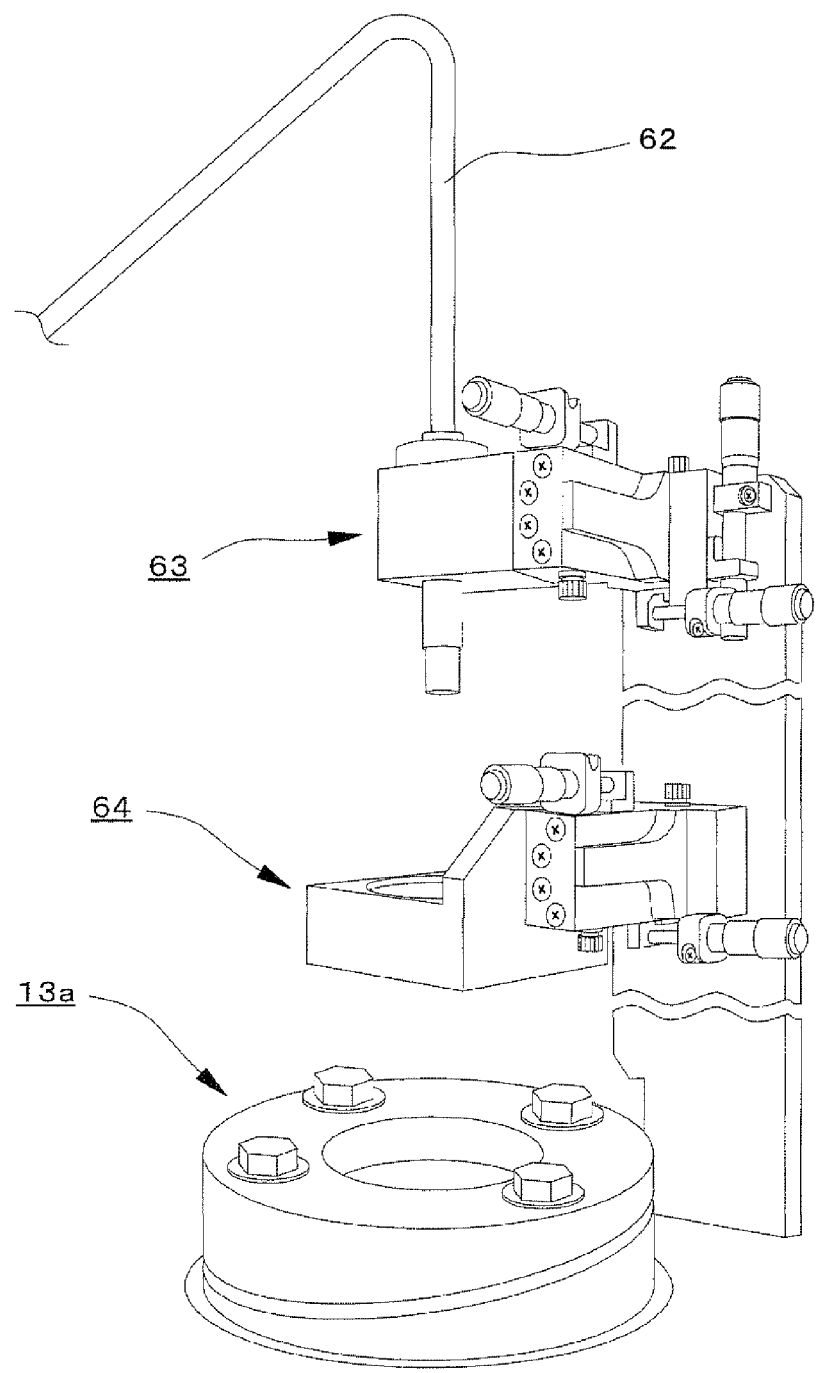
FIG. 8 is an explanatory view illustrating an arrangement example of a projection lens.
Figure 9:
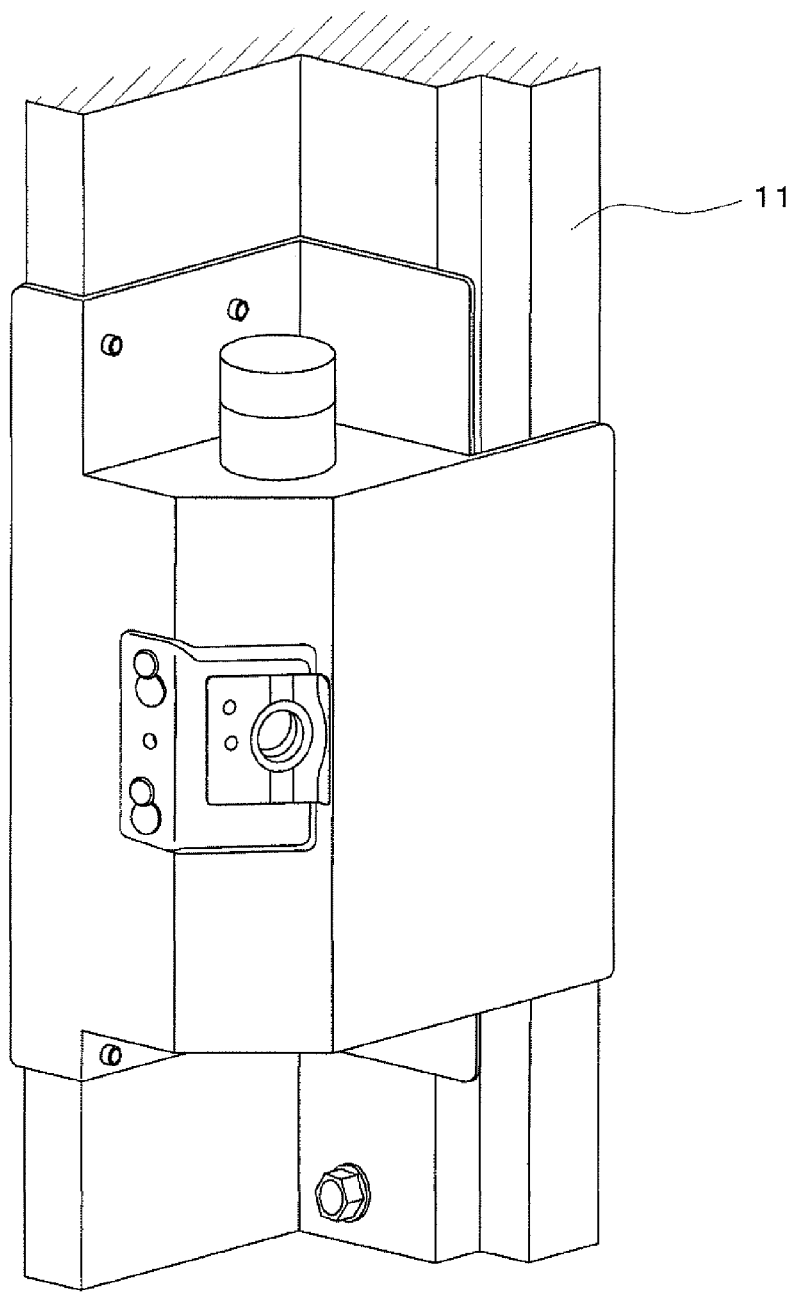
FIG. 9 is an explanatory view of a mirror unit.
Figure 10:
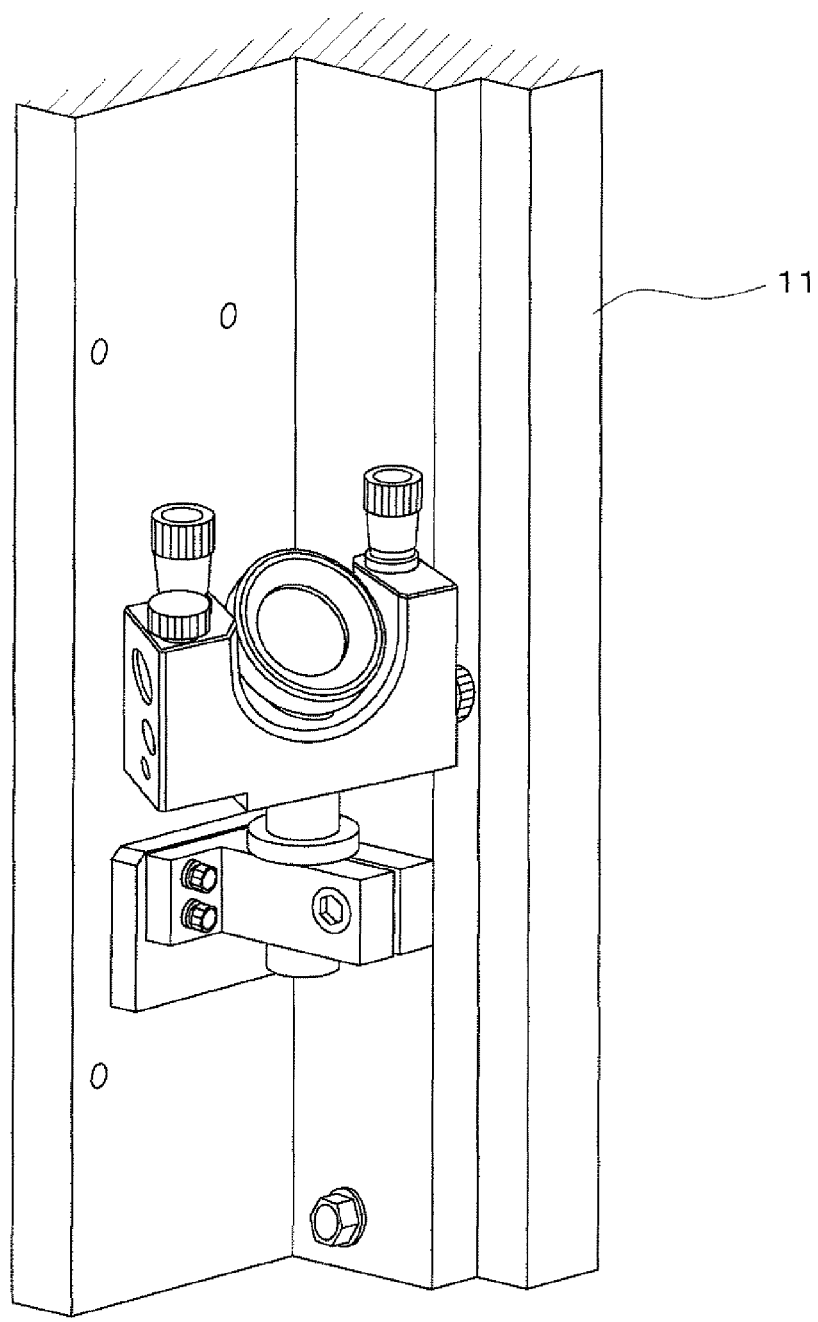
FIG. 10 is an explanatory view of the mirror unit.
Figure 11:
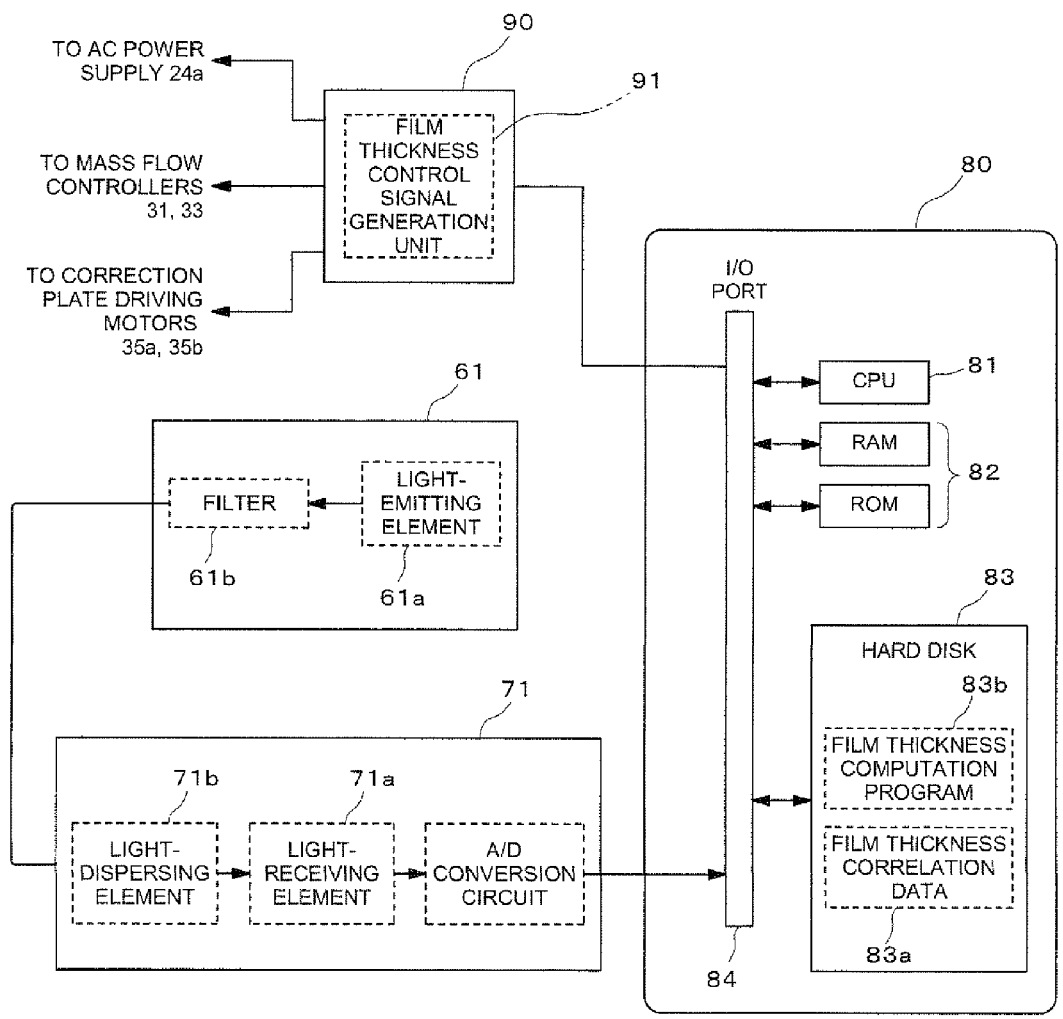
FIG. 11 is a block diagram illustrating a functional configuration of an optical film thickness measuring device and a thin film forming apparatus according to each embodiment of the present invention.
Figure 12:
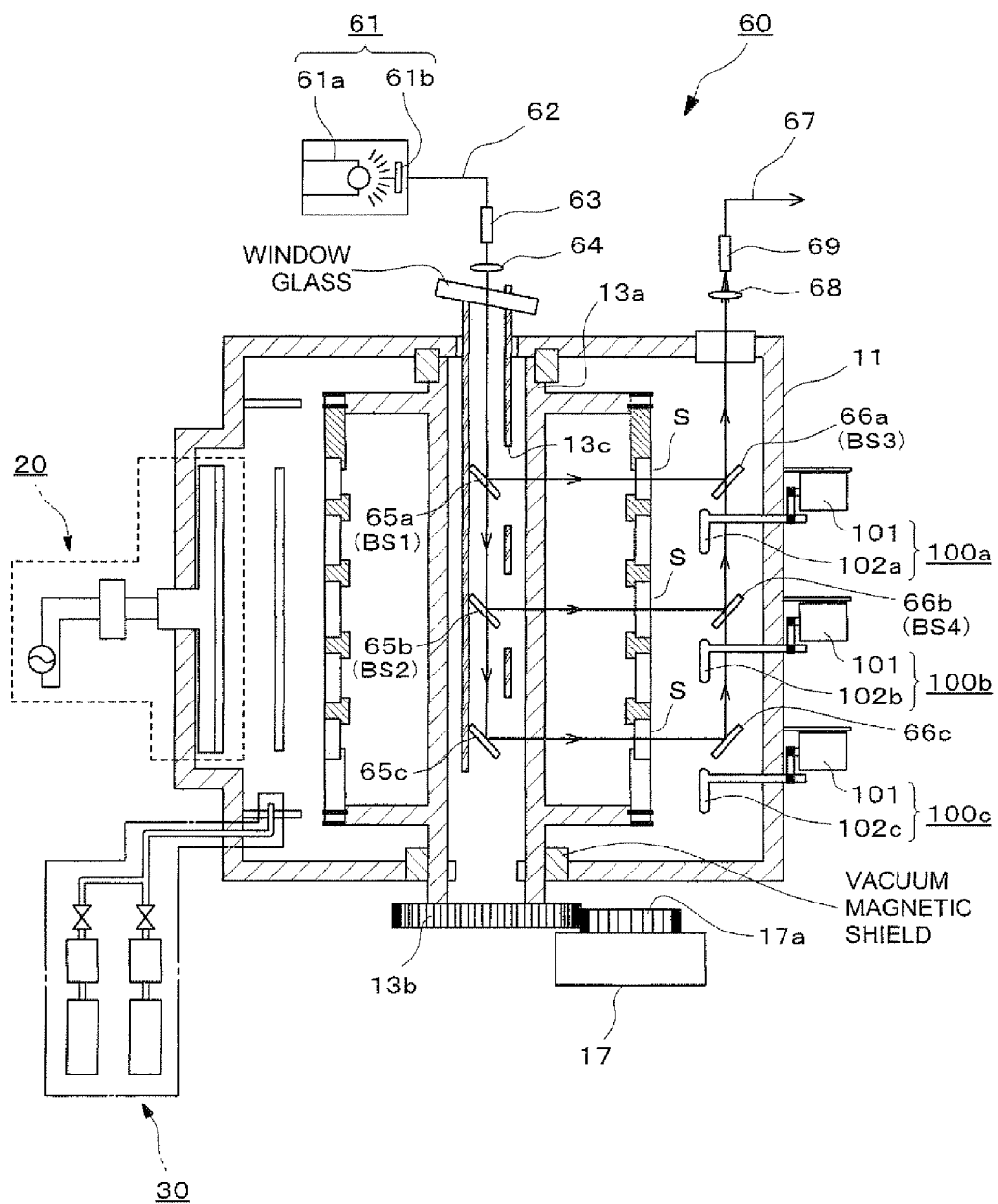
FIG. 12 is a similar cross-sectional explanatory view to FIG. 2, illustrating another embodiment.
Figure 13:
FIG. 13 is an explanatory view of a basic configuration of an optical film thickness measuring device, in which a projecting unit and a light receiving unit are arranged in the same direction.
Figure 13:
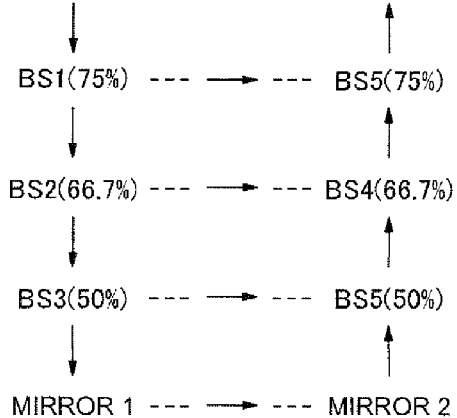
Figure 13:
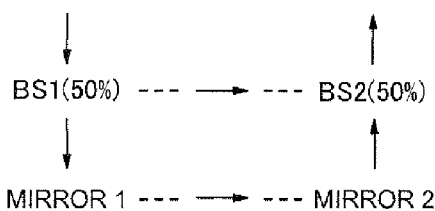
Figure 13:
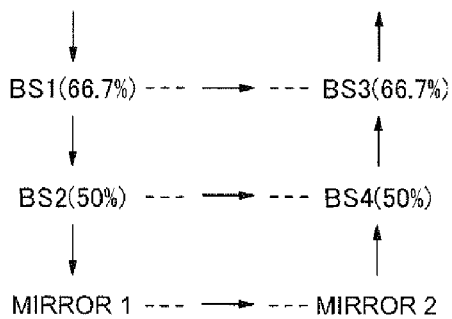
Figure 13:
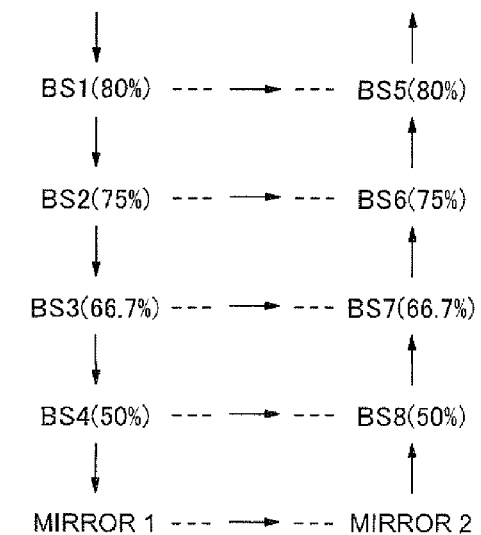
Figure 14:
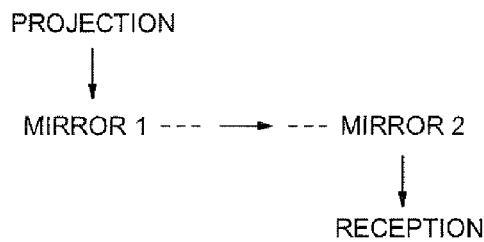
FIG. 14 is an explanatory view of a basic configuration of an optical film thickness measuring device, in which a projecting unit and a light receiving unit are arranged in the opposite directions.
Figure 14:
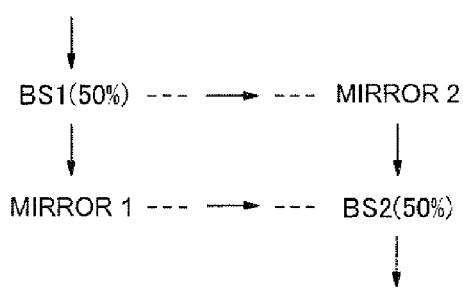
Figure 14:
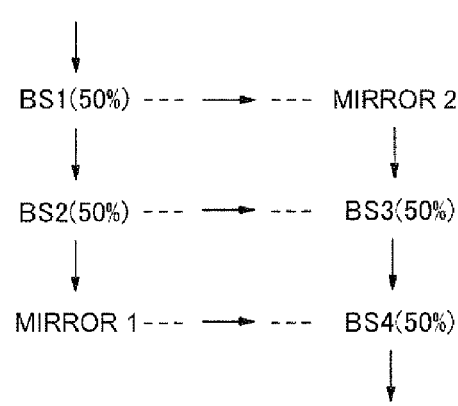
Figure 14:
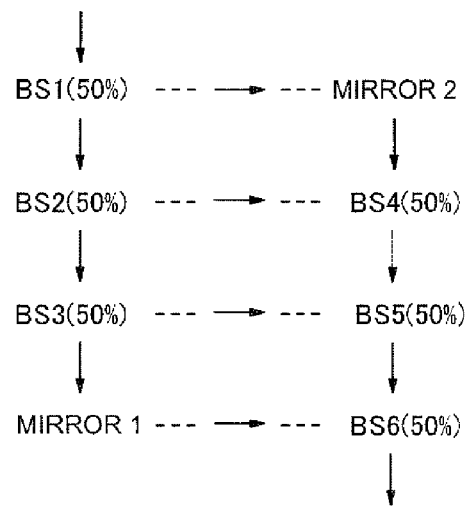
Figure 14:
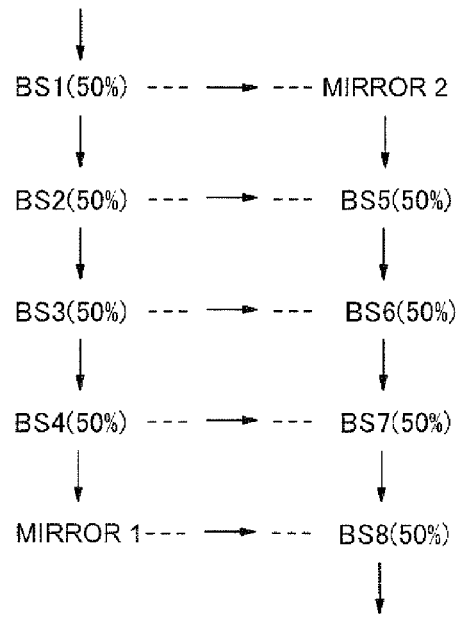

FIGS. 1 to 19 relates to embodiments of the present invention, in which FIG. 1 is a cross-sectional explanatory top view of an optical film thickness measuring device and a thin film forming apparatus; FIG. 2 is a cross-sectional explanatory view of the thin film forming apparatus of FIG. 1 along arrows A-A; FIG. 3 is a partial cross-sectional perspective top view of a rotating drum of FIG. 2; FIG. 4 is a similar partial cross-sectional perspective view to FIG. 3, illustrating a third embodiment; FIG. 5 is a similar cross-sectional explanatory view to FIG. 2, illustrating another example of the third embodiment; FIG. 6 is a partial cross-sectional perspective top view of a rotating drum of FIG. 5; FIG. 7 is a similar cross-sectional explanatory view to FIG. 2, illustrating another example of a fifth embodiment; FIG. 8 is an explanatory view illustrating an arrangement example of a projection lens; FIGS. 9 and 10 are explanatory views of a mirror unit; FIG. 11 is a block diagram illustrating a functional configuration of an optical film thickness measuring device and a thin film forming apparatus according to each embodiment; FIG. 12 is a similar cross-sectional explanatory view to FIG. 2, illustrating another embodiment; FIG. 13 is an explanatory view of a basic configuration of an optical film thickness measuring device, in which a projecting unit and a light receiving unit are arranged in the same direction; FIG. 14 is an explanatory view of a basic configuration of an optical film thickness measuring device, in which a projecting unit and a light receiving unit are arranged in the opposite directions; FIG. 15 is an explanatory view illustrating methods of calculating optical output in FIGS. 13 and 14, and comparison of relative optical output; FIG. 16 is a view illustrating the output from a base substrate (substrate) in the first embodiment; FIG. 17 is a view illustrating the output from a base substrate (substrate) in a second embodiment; FIG. 18 is a view illustrating the output from a base substrate (substrate) in a third embodiment; and FIG. 19 is a view illustrating the output from a base substrate (substrate) in a fourth embodiment.

A thin film forming apparatus 1 of the present embodiment forms an intermediate thin film on a substrate surface by performing a sputtering treatment of sputtering a target to attach a film raw material to a substrate surface so that a thin film comparably thinner than an intended film thickness is attached to the substrate surface and a plasma treatment of performing treatment such as oxidation on the film raw material to transform the composition of the thin film. The thin film forming apparatus 1 stacks a plurality of intermediate thin films by repeating the sputtering treatment and the plasma treatment several times to form a final thin film having an intended film thickness on the substrate surface.

Specifically, an intermediate thin film having an average film thickness of approximately 0.01 nm to 1.5 mm after the composition transform in the sputtering treatment and the plasma treatment is formed on the substrate surface, and a plurality of intermediate thin films is stacked by repeating the treatments every rotation of a rotating drum to form a final thin film having an intended film thickness of approximately several nm to several hundreds of nm.

As illustrated in FIGS. 1 and 2, main constituent components of the thin film forming apparatus 1 include a processing chamber 10 that includes a vacuum chamber 11 and a rotating drum 13, a sputtering means 20, a sputtering gas supply means 30, a plasma generation means 40, a reactive gas supply means 50, and an optical film thickness measuring device 60. In the figures, the sputtering means 20 is surrounded by dashed lines, the sputtering gas supply means 30 is surrounded by long dashed short dashed lines, the plasma generation means 40 is surrounded by dashed lines, and the reactive gas supply means 50 is surrounded by long dashed double-short dashed lines.

In a reaction process treatment, the plasma generation means 40 performs a plasma treatment on the film raw material attached to the surface of a base substrate (substrate) S in a film-formation process treatment to form an intermediate thin film made from a complete reactant or an incomplete reactant of the film raw material.

The plasma generation means 40 is configured to include a case member 41, a dielectric plate 42, an antenna 43, a matching box 44, and a high-frequency power supply 45. The case member 41 has a shape such that the case member 41 covers an opening formed on a wall surface of the vacuum chamber 11. The case member 41 is fixed to the wall surface of the vacuum chamber 11 so as to close the opening of the vacuum chamber 11. In this way, the plasma generation means 40 is attached to the wall surface of the vacuum chamber 11.

Main constituent components of the reactive gas supply means 50 include an oxygen gas cylinder 51 that stores oxygen gas, a mass flow controller 52 that adjusts a flow rate of the oxygen gas supplied from the oxygen gas cylinder 51, an argon gas cylinder 53 that stores argon gas, a mass flow controller 54 that adjusts a flow rate of the argon gas supplied from the argon gas cylinder 53, and a pipe 55 that introduces a mixed gas of the oxygen gas and the argon gas to a reaction process area.

Moreover, the plasma generation means 40 performs a plasma treatment on the film raw material attached to the surface of the base substrate (substrate) S by sputtering or the like to form an intermediate thin film made from a complete reactant or an incomplete reactant of the film raw material.

When power is supplied from the high-frequency power supply 45 to the antenna 43 in a state where oxygen gas is introduced into the reaction process area from the oxygen gas cylinder 51 and the argon gas cylinder 53 through an inlet port of the pipe 55, plasma is generated in a region of the reaction process area being facing the antenna 43. By this plasma, silicon (Si) in the film raw material formed on the surface of the base substrate (substrate) S or an incomplete silicon oxide ($SiO_x$ (where, $0<x<2$)) is oxidized, whereby an intermediate thin film made from a complete silicon oxide ($SiO_2$) or an incomplete silicon oxide ($SiO_x$ (where, $0<x<2$)) is obtained.

Next, the optical film thickness measuring device 50 according to an embodiment of the present invention will be described. The optical film thickness measuring device 60 measures a film thickness of a thin film formed on the surface of the base substrate (substrate) S. In the present embodiment, as illustrated in FIGS. 2 to 7 and 12, the optical film thickness measuring device 60 includes an emission side from which a measurement beam is emitted and a reception side on which the measurement beam having passed through the base substrate (substrate) S is received.

FIG. 8 is an explanatory view illustrating an arrangement example of a projection lens on the emission side. The emission side includes a light source 61 that emits a measurement beam, a projection optical fiber 62 that transmits the measurement beam from the light source 61, and a projection head 63 to which the measurement beam transmitted by the projection optical fiber 62 is guided.

The projection head 63 emits the measurement beam to a first beam splitter (BS1) 65a, a second beam splitter (BS2) 65b, and a first total reflection mirror 65c that are disposed within a rotating shaft. A projecting-side focusing lens 64 collects the measurement beam from the projection head 63.

FIGS. 9 and 10 are explanatory views of a mirror unit, in which FIG. 9 is an explanatory view of a mirror unit to which a contamination prevention shield is attached and FIG. 10 is an explanatory view of a mirror unit in which the contamination prevention shield is detached. The total reflection mirror illustrated in FIGS. 9 and 10 is a dielectric mirror.

In the present embodiment, the mirror unit includes the first beam splitter (BS1) 65a that allows a portion of the measurement beam from the projection head 63 to pass therethrough and guides a portion of the measurement beam to a product base substrate (substrate) S as a base substrate, the second beam splitter (BS2) 65b that allows another portion of the measurement beam having passed through the first beam splitter (BS1) 65a to pass therethrough and guides a portion of the measurement beam to the product base substrate (substrate) S, and the first total reflection mirror 65c that reflects the measurement beam having passed through the second beam splitter (BS2) 65b. The projection optical fiber 62 is connected to the light source 61, and one end of the projection optical fiber 62 is inserted into the light source 61 so that the measurement beam having passed through a filter of the light source 61 is incident on the end surface of the projection optical fiber 62 and guided to the projection head 63.

The projection head 63 is disposed outside the vacuum chamber 11 on an upper side (FIG. 2) of a rotating shaft 13a so as to face the first beam splitter (BS1) 65a, the second beam splitter (BS2) 65b, and the first total reflection mirror 65c that are disposed inside the rotating shaft 13a. The measurement beam emitted from the projection head 63 enters from one end of the rotating shaft 13a, passes inside the rotating shaft 13a along the axial direction thereof, and is emitted to the first beam splitter (BS1) 65a, the second beam splitter (BS2) 65b, and the first total reflection mirror 65c.

The first beam splitter (BS1) 65a, the second beam splitter (BS2) 65b, and the first total reflection mirror 65c are configured so as to be fixed to a predetermined inner position of the rotating shaft 13a, and in this case, the angular positions thereof can be adjusted.

Main constituent components of the reception side include a third beam splitter (BS3) 66a, a fourth beam splitter (BS4) 66b, and a second total reflection mirror 66c that reflect the measurement beam having passed through the base substrate (substrate) S toward the reception head 69, a receiving-side focusing lens 68 that collects the measurement beam having passed through or reflected from the third beam splitter (BS3) 66a, the fourth beam splitter (BS4) 66b, and the second total reflection mirror 66c, a reception head 69, a receiving-side optical fiber 67 that transmits the measurement beam received by the reception head 69, and a spectroscopic measurement device 71 that disperses the measurement beam transmitted by the receiving-side optical fiber 67. That is, the reception side is configured to allow the measurement beam, which has passed through or reflected from the third beam splitter (BS3) 66a, the fourth beam splitter (BS4) 66b, and the second total reflection mirror 66c and has passed through the base substrate (substrate) S, to be reflected from or pass through the third beam splitter (BS3) 66a, the fourth beam splitter (BS4)

66b, and the second total reflection mirror 66c and guide the measurement beam to the spectroscopic measurement device 71 as a measurement beam.

Further, the light source 61, the projection optical fiber 62, and the projection head 63 correspond to a projecting unit of the present invention. Further, the reception head 69, the receiving-side optical fiber 67, and the spectroscopic measurement device 71 correspond to a light receiving unit. Moreover, the first total reflection mirror 65c corresponds to an inner optical reflection member, and the second total reflection mirror 66c corresponds to an outer optical reflection member.

The third beam splitter (BS3) 66a, the fourth beam splitter (BS4) 66b, and the second total reflection mirror 66c on the reception side are configured so as to be fixed to a predetermined position by a holding member (not illustrated) (for example, a rod-shaped member having an optional cross-sectional shape), and in this case, the angular positions thereof can be adjusted.

Moreover, reference numerals 100a to 100c designate optical path switching shutters that include a driving unit 101 and shielding plates 102a to 102c.

The optical path switching shutters 100a to 100c have a configuration in which a servo motor (other actuators or the like) is used as the driving unit 101, the shielding plates 102a to 102c are moved by the driving unit 101, and the shielding plates 102a to 102c are moved to a position where the shielding plates 102a to 102c block the measurement beam from the emission side so as not to enter the third beam splitter (BS3) 66a, the fourth beam splitter (BS4) 66b, and the second total reflection mirror 66c and a position where the measurement beam is not blocked. The shape or the like of the shielding plates 102a to 102c is not particularly limited as long as the shielding plates 102a to 102c can block the measurement beam. In the optical path switching shutters 100a to 100c, the driving unit 101 is provided outside the vacuum chamber 11 as a driving source.

The shielding plates 102a to 102c are configured so as to be moved to a position where the measurement beams from the beam splitters (BS1, BS2) 65a and 65b and the first total reflection mirror 65c are not blocked. The shielding plates 102a to 102c also have a role of preventing contamination. The driving unit 101 is disposed outside the vacuum chamber.

Moreover, the first total reflection mirror 65c and the second total reflection mirror 66c are members prepared by forming a thin film of aluminum or the like on a surface of a base substrate of glass or the like and have high reflectance of approximately 100% at least in the wavelength of the measurement beam. The total reflection mirrors of the present embodiment are formed of a plate-shaped member having an approximately square shape. The total reflection mirrors are arranged inside a hollow body of the rotating shaft 13a and are fixed to the inner wall surface of the rotating shaft 13a by welding, screwing, or the like.

The light source 61 of the present embodiment uses a halogen lamp, a white LED, or the like and is a device that is provided outside the vacuum chamber 11 so as to emit the measurement beam for measuring a film thickness. As illustrated in FIG. 11, the light source 61 includes a light-emitting element 61a that receives power supplied from a power supply (not illustrated) and emits light and a filter 61b that allows the light with a specific wavelength region in the light emitted from the light-emitting element 61a to pass there through.

An opening 13c that is cutout in a portion of a side wall is formed in a central portion of the rotating shaft 13a, and the measurement beam reflected from the beam splitters (BS1, BS2) 65a and 65b and the first total reflection mirror 65c is emitted to the base substrate (substrate) S held on the rotating drum 13 through the opening 13c. Moreover, in the present embodiment, although an example in which the opening 13c is formed is illustrated, a sealed structure may be created using a glass member through which the light can completely pass.

As described above, in the present invention, unlike the related art, the film thickness of a product substrate itself is directly measured without requiring a monitor substrate for measuring a film thickness. Moreover, unlike the related art, it is not necessary to use a transparent glass material as the monitor substrate or a plastic or the like as a material that allows the wavelength of the measurement beam to pass therethrough at a high transmittance.

The measurement beam emitted from the emission side to the base substrate (substrate) S is divided by the beam splitter into a measurement beam moving toward the base substrate (substrate) S and a passing measurement beam, which are finally reflected by the total reflection mirror.

That is, a portion of the measurement beam emitted to the first beam splitter (BS1) 65a is reflected from the first beam splitter (BS1) 65a and then enters from a rear surface side (that is, the rotating shaft 13a side) of the base substrate (substrate) S and passes through the inside of the base substrate (substrate) S. The measurement beam that has passed through the first beam splitter (BS1) 65a without being reflected is guided to the next second beam splitter (BS2) 65b, and a portion thereof is reflected from the second beam splitter (BS2) 65b and then enters from the rear surface side (that is, the rotating shaft 13a side) of the base substrate (substrate) S and passes through the inside of the base substrate (substrate) S. Further, the measurement beam that has passed through the second beam splitter (BS2) 65b without being reflected is guided to the first total reflection mirror 65c. The first total reflection mirror 65c is formed of a member having high reflectance of approximately 100% in the wavelength of the measurement beam. These measurement beams emitted from the emission side are received on the reception side.

Similarly to the projection head 63, the reception head 69 is disposed outside the vacuum chamber 11 on the upper side (FIG. 2) of the rotating shaft 13a, and the third beam splitter (BS3) 66a, the fourth beam splitter (BS4) 66b, and the second total reflection mirror 66c for reflecting the measurement beam emitted from the emission side so as to be guided to the reception head 69 are disposed in a predetermined position on a peripheral side of the rotating drum 13 that is disposed in the vacuum chamber 11. In the present embodiment, as illustrated in FIG. 2, the reception head 69 is disposed at a position furthest from the sputtering means 20 and the plasma generation means 40. As a result, the reception head 69 is configured to be rarely influenced by the sputtering means 20 and the plasma generation means 40.

The reception head 69 is disposed at a position where the measurement beam reflected by the first beam splitter (BS1) 65a, the second beam splitter (BS2) 65b, and the first total reflection mirror 65c is incident, and one end of the receiving-side optical fiber 67 is connected to the reception head 69, and the other end is connected to the spectroscopic measurement device 71. The measurement beam having passed through the base substrate (substrate) S is reflected by the third beam splitter (BS3) 66a, the fourth beam splitter (BS4) 66b, and the second total reflection mirror 66c, collected by the receiving-side focusing lens 68, and incident on the reception head 69. The incident measurement beam is guided to the receiving-side optical fiber 67 and input to the spectroscopic measurement device 71.

As described above, since the projection head 63 and the reception head 69 are provided outside the vacuum chamber 11, it is possible to prevent problems such as twisting or tangling of an optical fiber due to the rotation of the rotating drum 13 which may occur when the projection head 63 and the reception head 69 are disposed inside the rotating drum 13. Moreover, the projection head 63 and the reception head 69 are disposed outside the vacuum chamber 11, it is possible to eliminate a problem that the rotating drum 13 is heated in the course of film-formation, and the projection head and the reception head are thermally deformed by the heat. In this way, in the present invention, it is possible to prevent the twisting or tangling of the optical fiber and the influence of heat generated in the course of film-formation and to perform stable film thickness measurement.

The spectroscopic measurement device 71 is a device that measures the intensity of light of a predetermined wavelength in the reflection beam and has the same configuration as an existing spectroscopic measurement device used in measuring a film thickness. That is, as illustrated in FIG. 11, the spectroscopic measurement device 71 includes a light-dispersing element 71b that allows the light within a predetermined wavelength region in the reflection beam to pass therethrough, and a light-receiving element 71a that receives light having passed through the light-dispersing element 71b and outputs a current value corresponding to the intensity of the light.

The light-dispersing element 71b is formed of a member having a diffraction lattice such as a grating, for example, and allows the light within a predetermined wavelength region to pass therethrough. In the present embodiment, the light-dispersing element 71b allows the wavelength of the measurement beam to pass therethrough at least at the transmittance of approximately 100%. The light having passed through the light-dispersing element 71b is guided to the light-receiving element 71a. The light-receiving element 71a is formed of a semiconductor element such as a photodiode, for example, and an element in which p and n-type semiconductors are bonded may be used, for example. When light strikes the bonding surface of the p and n-type semiconductors, a current corresponding to the intensity of the light is generated. The current is converted into a digital signal by an A/D conversion circuit in the spectroscopic measurement device 71, and the digital signal is output from the spectroscopic measurement device 71 to a film thickness computing unit 80 described later.

The film thickness computing unit 80 is a means that computes the film thickness of a thin film formed on the base substrate (substrate) S based on the intensity of the measurement beam measured by the spectroscopic measurement device 71. As illustrated in FIG. 11, the film thickness computing unit 80 includes a CPU 81 as a computing means, a hard disk 83 and a memory (specifically, ROM and RAM) 82 as a storage means, and an I/O port 84 as an input/output port used when transmitting and receiving signals to/from an external device or the like. The film thickness computing unit 80 corresponds to a film thickness computing unit of the present invention.

The film thickness computing unit 80 is electrically connected to the spectroscopic measurement device 71, and the signal that represents the intensity of the measurement beam and is digitalized by the spectroscopic measurement device 71 is input to the hard disk 83 and the memory (specifically ROM and RAM) 82 as the storage means via the I/O port 84 of the film thickness computing unit 80. For example, film thickness correlation data 83a in which a correlation between a change of the intensity of the measurement beam and the film thickness of the thin film formed on the base substrate (substrate) S and a film thickness computation program 83b that computes a film thickness based on the measurement beam intensity signal transmitted from the spectroscopic measurement device 71 and the film thickness correlation data 83a are stored in the hard disk 83. The film thickness correlation data 83a and the film thickness computation program 83b may be stored in RAM, ROM, or the like.

Hereinafter, a principle of measuring the film thickness using the film thickness computing unit 80 will be described. A measurement beam emitted to the base substrate (substrate) S is reflected at the boundary between the base substrate (substrate) S and the thin film and the boundary between the thin film and the vacuum chamber. In this case, these reflection beams interfere with each other, and the intensity of the reflection beam is changed.

Here, a predetermined correlation is present between the intensity of the reflection beam or the transmission beam of the thin film and the film thickness. More specifically, it is known that when a refractive index of a thin film is n, a wavelength is λ, and a geometric film thickness is d, the intensity of a reflection beam exhibits peaks periodically whenever an optical film thickness nd becomes an integer multiple of λ/4. Since the height of peaks (peak value P) and a refractive index have a predetermined correlation, it is possible to obtain a refractive index by obtaining the peak value P. That is, the peak value P is obtained by measuring the intensity of the reflection beam, and the geometric film thickness d can be calculated from the optical film thickness nd based on the values of the refractive index n and the wavelength λ.

The film thickness computing unit 80 stores the wavelength □ of the measurement beam as a setting value in advance. Moreover, the film thickness computation program 83b obtains the height of the peak value P from the reflection beam intensity signal transmitted from the spectroscopic measurement device 71 to compute the refractive index n. Further, the film thickness computation program 83b calculates the geometric film thickness d based on the values of the refractive index n and the wavelength□.

The film thickness computing unit 80 is electrically connected to the film thickness controller 90. The film thickness controller 90 includes a computing means such as a MPU, a storage means such as ROM and RAM, and an input/output port that transmits and receives an electrical signal to/from other devices. A film thickness (that is, a geometric film thickness d) measured by the film thickness computing unit 80 is input to the film thickness controller 90. The film thickness controller 90 includes a film thickness control signal generation unit 91 and controls the film thickness by adjusting a film-formation rate and a film-formation period based on the film thickness signal generated by the film thickness control signal generation unit 91.

Specifically, the film thickness controller 90 adjusts the film-formation rate based on the film thickness acquired from the film thickness computing unit 80 according to at least one of a method of increasing or decreasing the power supplied to targets 22a and 22b from the AC power supply 24a of the sputtering means 20, a method of increasing or decreasing the amount of sputtering gas and reactive gas supplied to the film-formation process area by the sputtering gas supply means 30, and a method of moving the film thickness correction plates 36a and 36b by correction plate driving motors 35a and 35b. Reference numeral 36c is a film thickness correction plate, and the film thickness controller 90 corresponds to a film thickness adjustment means.

Moreover, the film thickness may be adjusted by adjusting the film-formation period. That is, when the film thickness of the base substrate (substrate) S acquired by the film thickness computing unit 80 is smaller than a preset film thickness, the film thickness controller 90 extends the film-formation period without ending the film-formation at a predetermined film-formation ending time to increase the film thickness to a preset film thickness. On the other hand, when the film thickness of the base substrate (substrate) S acquired by the film thickness computing unit 80 is larger than a preset film thickness, the film thickness controller 90 shortens the film-formation period by ending the film-formation before a predetermined film-formation ending time to end the film-formation at a preset film thickness. The film thickness may be adjusted by using only one of these film thickness control methods and may be adjusted by a combination of a plurality of methods.

As described above, the optical film thickness meter according to the present embodiment can automatically calculate the film-formation rate during the film-formation and control the film thickness. Moreover, by outputting a control signal to an automatic correction plate mechanism, it is possible to control the film thickness and the quality of an optical thin film product. For example, in the case of a stationary photometric method, it is possible to control the film thickness by analyzing the film thickness from the measurement results of the spectroscopic properties of the base substrate (substrate) S.

On the other hand, in the case of a rotating photometric method, the amount of the transmission beam of the base substrate (substrate) S is measured and the film thickness can be controlled.

First, a basic configuration of the present invention is configured as illustrated in FIGS. 13 to 15. That is, in the case of one branch, mirrors 1 and 2 are used during projection and reception. In the case of two branches, two BSs (BS1, BS2) and two mirrors (mirrors 1 and 2) are used during projection and reception. In the case of three branches, four BSs (BS1 to BS4) and two mirrors (mirrors 1 and 2) are used. In the case of four branches, six BSs (BS1 to BS6) and two mirrors (mirrors 1 and 2) are used In the case of five branches, eight BSs (BS1 to BS8) and two mirrors (mirrors 1 and 2) are used.

The arrangements of the mirrors and the BSs, when the projecting unit and the light receiving unit are in the same direction and when they are in the opposite directions, are as follows. The mirrors are arranged to face each other when the projecting unit and the light receiving unit are in the same direction, and the mirrors are always arranged so as to face each other at the last reflecting position except for the case of one branch. In the case of mirrors in the opposite directions, the receiving-side mirror is fixed to the initially disposed position, and the projecting-side mirror is disposed at a position such that the mirror is moved sequentially downward for every additional branch.

Moreover, according to a method of calculating output light when the projecting unit and the light receiving unit are in the same direction, the relative optical output $P=(100\%/n)^2$. That is, $P=100\%$ for one branch, $n=2$ and $P=25\%$ for two branches, and $n=3$ and $P=11.1\%$ for three branches.

Similarly, according to a method of calculating output light when the projecting unit and the light receiving unit are in the opposite directions, the relative optical output $P=(50\%)^n$. That is, $P=100\%$ for one branch, $n=2$ and $P=25\%$ for two branches, and $n=3$ and $P=12.5\%$ for three branches.

FIG. 15 illustrates a table of comparison between the relative outputs for the case of respective branches.

The first to fourth embodiments will be described in detail with reference to FIGS. 16 to 19.

<First Embodiment>

The first embodiment is an example in which an aluminum reflection mirror with reflectance of 90% is used as the first and second total reflection mirrors 65c and 66c. The first beam splitter (BS1) 65a has a reflectance/transmittance ratio of 18/82 and the second beam splitter (BS2) 65b has a reflectance/transmittance ratio of 45/55. The first total reflection mirror 65c and the second total reflection mirror 66c are aluminum reflection mirrors and have reflectance of 90%. The third beam splitter (BS3) 66a and the fourth beam splitter (BS4) 66b have a reflectance/transmittance ratio of 50/50. With the above mirrors and beam splitters, the transmittance values (efficiencies) of the measurement beam of the base substrate (substrate) S of the respective products on the upper, middle, and lower stages are 9%, 9.2%, and 9.1%, respectively. The optical path can be switched by the optical path switching shutters 100a to 100c.

The transmittance values of the base substrate (substrate) S on the upper, middle, and lower stages of the drum are measured in the following order.

|  | Upper Stage | Middle Stage | Lower Stage |
| --- | --- | --- | --- |
| Shielding Plate 102a | off | on | on |
| Shielding Plate 102b | on | off | on |
| Shielding Plate 102c | on | on | off |

Alternatively, the average transmittance value of the base substrate (substrate) S of the products is measured as T (average)=(T1+T2+T3)/3 in a state where the shielding plates 102a, 102b, and 102c are all in the off state.

More specifically, the transmittance from the base substrate (substrate) S of the upper-stage product to the base substrate (substrate) S of the lower-stage product via the base substrate (substrate) S of the middle-stage product is measured in the following order.

Regarding upper-stage product base substrate (substrate) S, middle-stage product base substrate (substrate) S, and lower-stage product base substrate (substrate) S, optical path switching shutter 100a is ON→OFF→ON, optical path switching shutter 100b is OFF→ON→OFF, and optical path switching shutter 100c is OFF→OFF→OFF.

A dark current is measured in the following conditions:

Dark Current 1: Optical path switching shutter 100a is on, and Optical path switching shutters 100b and 100c are off;

Dark Current 2: Optical path switching shutter 100b is on, and Optical path switching shutters 100a and 100c are off; and Dark Current 3: Optical path switching shutter 100c is on, and Optical path switching shutters 100a and 100b are off.

An average transmittance value of the base substrate (substrate) S of the products are measured as T(average)=(T1+T2+T3)/3 in a state where three optical path switching shutters 100a to 100c are in the off state.

The relative light intensities (%) of the upper-stage product base substrate (substrate) S, the middle-stage product base substrate (substrate) S, and the lower-stage product base substrate (substrate) S according to the first embodiment are as illustrated in FIG. 16. The measurement beam is very evenly distributed.

<Second Embodiment>

The first beam splitter (BS1) 65a and the third beam splitter (BS3) 66a according to the second embodiment are formed of a dielectric mirror and have a reflectance/transmittance ratio of 33.3/66.7 as illustrated in FIG. 17. The second beam splitter (BS2) 65b and the fourth beam splitter (BS4) 66b have a reflectance/transmittance ratio of 50/50. Moreover, the first total reflection mirror 65c and the second total reflection mirror 66c are formed of a dielectric mirror having reflectance of 99.9%. That is, in the first embodiment, an aluminum mirror having reflectance of 90% is used as the first and second total reflection mirrors 65c and 66c. In contrast, in the second embodiment, a dielectric mirror having reflectance of 99.9% is used as the first and second total reflection mirrors 65c and 66c.

In this way, in the second embodiment, a multi-work photometric optical system is used. Specifically, the first beam splitter (BS1) 65a has a reflectance/transmittance ratio of 33.3/66.7, the second beam splitter (BS2) 65b has a reflectance/transmittance ratio of 50/50, and the dielectric of the first total reflection mirror 65c and the second total reflection mirror 66c has reflectance ratio of 99.9%. The third beam splitter (BS3) 66a has a reflectance/transmittance ratio of 33.3/66.7, and the fourth beam splitter (BS4) 66b has a reflectance/transmittance ratio of 50/50. The transmittance values (efficiencies) of the measurement beam of the base substrate (substrate) S of the respective products on the upper, middle, and lower stages are all 11%, 11%, and 11%. The optical path can be switched by the optical path switching shutters 100a to 100c.

The relative light intensities (%) of the upper-stage product base substrate (substrate) S, the middle-stage product base substrate (substrate) S, and the lower-stage product base substrate (substrate) S according to the second embodiment are as illustrated in FIG. 17.

<Third Embodiment>

FIGS. 4 and 18 illustrate the third embodiment, and FIG. 4 illustrates the same partial cross-sectional perspective views as FIG. 3. The present embodiment illustrates an example in which a shutter device is not used, and five branches are used. The same materials, members, arrangements, and the like as those of the above embodiments will be denoted by the same reference numerals, and description thereof will not be provided.

The present embodiment illustrates an example in which four sets of beam splitters (165a to 165d and 166a to 166d) and one set of total reflection mirrors (165e and 166e) are used are used on the emission side and the reception side. With the configuration according to this example, it is possible to measure the film thicknesses of all base substrates (substrates) S provided on the holding portion.

In this case, similarly to the above-described embodiments, the beam splitter is selected so that the measurement beam to all base substrates (substrates) S has the same intensity. That is, in order to make the intensities of the measurement beams moving toward five base substrates (substrates) S to be the same, a beam splitter configured such that 20% of the measurement beam moves toward the base substrate (substrate) S is used as the first beam splitter (BS1) 165a. Similarly, a beam splitter configured such that 20%, which is the same amount of beam reflected by the first beam splitter (BS1) 165a, of the 80% measurement beam having passed through the first beam splitter (BS1) 165a moves toward the base substrate (substrate) S. In this manner, the beam splitters are used sequentially. In this way, in the last total reflection mirror 165e, 20% of the original measurement beam is emitted to the base substrate (substrate) S. Moreover, on the reception side, a beam splitter having a configuration opposite to that of the emission side is used. With the above-described configuration, the optical path switching shutters 100a to, 100c are not necessary.

More specifically, the first beam splitter (BS1) 155a and the fifth beam splitter (BS5) 166a have a relative light intensity of 20%, the second beam splitter (BS2) 165b and the sixth beam splitter (BS6) 166b have a relative light intensity of 25%, the third beam splitter (BS3) 165c and the seventh beam splitter (BS7) 166c have a relative light intensity of 33.3%, and the fourth beam splitter (BS4) 165d and the eighth beam splitter (BS8) 166d have a relative light intensity of 50%.

The case of five branches or more can be handled. The relative optical output is as follows.

1 Branch: 100%
2 Branches: 25%
3 Branches: 11%
4 Branches: 6.25%
5 Branches: 4%

In the case of n branches, the relative optical output is $P=(100\%/n)^2$.

Here, $X1 =100\%-100\%/n$ and $Y1 =X1$ for the first beam splitter 1 (BS1).

Y1:X1 is used for the first beam splitter 1(BS1).

Similarly, $X2=100\%-100\%/(n-1)$ and $Y2=X2$ for the second beam splitter 2 (BS2).

$X3=100\%-100\%/(n-2)$ and $Y3=X3$ for the third beam splitter 3(BS3).

Thus, the i-th beam splitter i (BSi) is determined as $Xi=100\%-100\%/(n-(i-1))$ and $Yi=Xi$ (i<n).

<Fourth Embodiment>

FIG. 19 illustrates the fourth embodiment. As described above, the i-th beam splitter i (BSi) is determined as $Xi=100\%-100\%/(n-(i-1))$ and $Yi=Xi$ (i<n), and in this example, the case of four branches is illustrated.

More specifically, the first beam splitter (BS1) and the fourth beam splitter (BS4) have a relative light intensity of 75%, the second beam splitter (BS2) and the fifth beam splitter (BS5) have a relative light intensity of 33.3%, and the third beam splitter (BS3) and the sixth beam splitter (BS6) have a relative light intensity of 50%.

FIGS. 5 and 6 illustrate another embodiment of the device, in which FIG. 5 is a similar cross-sectional explanatory view to FIG. 2, and FIG. 6 is a partial cross-sectional perspective top view of the rotating drum of FIG. 5. In this embodiment, the same materials, members, arrangements, and the like as those of the respective embodiments above will be denoted by the same reference numerals, and description thereof will not be provided.

The present embodiment illustrates an example in which the beam splitters 166a to 166d and the total reflection mirror 166e on the reception side are attached within a cylindrical member 160 similarly to the rotating shaft 13a on the emission side. Moreover, the beam splitters 166a to 166d and the total reflection mirror 166e on the reception side are provided in the cylindrical member 160 by means of an existing means so that the tilt angles thereof can be adjusted. Further, an opening is formed at a position of the cylindrical member 160 corresponding to the optical path of the measurement beam so as not to interrupt the measurement beam moving to the beam splitters 166a to 166d and the total reflection mirror 166e on the reception side. In the present embodiment, although an example in which an opening is formed is illustrated, a sealed structure may be created using a glass member through which light can completely pass.

By configuring in this manner, just by attaching the cylindrical member 160 within the vacuum chamber 11, the arrangement on the reception side can be realized and the attachment is easy. Moreover, it is possible to draw the cylindrical member 160 and perform adjustment, repair, and the like during maintenance.

<Fifth Embodiment>

Next, the fifth embodiment illustrated in FIG. 7 will be described. In this example, in contrast to the first embodiment in which the light receiving unit and the projecting unit are in the same direction (or on the same surface), the light receiving unit and the projecting unit are on the opposite sides as illustrated in FIG. 7. In this embodiment, the same materials, members, arrangements, and the like as those of the respective embodiments above will be denoted by the same reference numerals, and description thereof will not be provided.

In this example, the first beam splitter (BS1) 65a and the second beam splitter (BS2) 65b have a reflectance/transmittance ratio of 50%, the total reflection mirrors 66c and 66k are formed of a dielectric mirror having reflectance of R>99.9%, and the beam splitter (BS3) 66l and the beam splitter (BS4) 66m have a reflectance/transmittance ratio of 50%. Basically, the device has such a configuration as illustrated in FIGS. 14 and 15.

In this way, the projecting unit and the light receiving unit can be configured to be provided in the opposite directions of the optical thin film forming apparatus or on the opposite planar positions. Naturally, the configurations described in the second to fourth embodiments and illustrated in the respective figures can be applied to this embodiment.

FIG. 12 is a similar cross-sectional explanatory view to FIG. 2, illustrating another embodiment. In this example, the beam splitters 65a and 65b and the total reflection mirror 65c on the emission side are disposed inside the rotating shaft 13a. The rotating shaft 13a is configured to be maintained as a vacuum by disposing a vacuum magnetic shield for maintaining vacuum. A glass window is disposed on the emission side so as to prevent entrance of foreign materials and impurities. With this configuration, it is not necessary to dispose a contamination prevention shield in the respective beam splitters.

The invention claimed is:

1. An optical film thickness measuring device for an optical thin film forming apparatus including a rotating base substrate holder, comprising:
    a projector that projects a measurement beam from one side of an axial line of a rotating shaft of the rotating base substrate holder toward an inside of the base substrate holder,
    a light receiver that receives the measurement beam from the projector,
    a plurality of inner beam splitters that is provided inside the base substrate holder so as to reflect the measurement beam projected from the projector to a base substrate,
    an inner optical reflector that is provided inside the base substrate holder so as to totally reflect a measurement beam from a closest inner beam splitter among the plurality of inner beam splitters,
    a plurality of external beam splitters that is provided outside the base substrate holder so as to reflect the measurement beam from the plurality of inner beam splitters toward the light receiver, and
    an outer optical reflector that is provided outside the base substrate holder so as to reflect the measurement beam from the inner optical reflector toward the light receiver; wherein
    the measurement beam reflected by the plurality of inner beam splitters and the inner optical reflector is passed through the base substrate and then reflected by the plurality of external beam splitters and the outer optical reflector so as to be guided to the light receiver, so that the measurement beam is received by the light receiver.

2. The optical film thickness measuring device according to claim 1, wherein
    the axial line of the rotating shaft of the base substrate holder is positioned within a hollow rotating shaft that forms a center of the base substrate holder,
    the inner beam splitter and the inner optical reflector are disposed within the rotating shaft, and
    the rotating shaft is configured such that a wall surface of the rotating shaft allows the reflected measurement beam to pass therethrough.

3. The optical film thickness measuring device according to claim 1, wherein
    the measurement beams reflected by the inner beam splitter and the inner optical reflector have substantially a same intensity.

4. The optical film thickness measuring device according to claim 1, further comprising
    a film thickness computing unit that computes a film thickness of a thin film formed on the base substrate based on the measurement beam received by the light receiver.

5. The optical film thickness measuring device according to claim 1, wherein
    the plurality of external beam splitters and the outer optical reflector are covered with a hollow housing, and
    a portion of the housing to which the measurement beam is incident is configured such that the portion allows the measurement beam to pass therethrough.

6. The optical film thickness measuring device according to claim 1, wherein
    a shutter device is provided between the plurality of external beam splitters and the outer optical reflector.

7. The optical film thickness measuring device according to claim 1, wherein
    the projector and the light receiver are provided in a same direction or at a same planar position of the optical thin film forming apparatus.

8. The optical film thickness measuring device according to claim 1, wherein
    the projector and the light receiver are provided in an opposite directions or at an opposite planar positions of the optical thin film forming apparatus.

9. A rotating thin film forming apparatus forming a thin film comprising:
    a base substrate holder capable of rotating about an axial line of a rotating shaft in a state where a base substrate disposed in a vacuum chamber is held,
    a film raw material supplier that supplies a film raw material for forming the thin film to the vacuum chamber, and
    a film-formation process area in which the thin film is formed on the base substrate
    wherein the rotating thin film forming apparatus uses an optical film thickness measuring device according to claim 1.

* * * * *